(12) United States Patent
Matsueda

(10) Patent No.: US 6,392,354 B1
(45) Date of Patent: May 21, 2002

(54) ELECTRO-OPTICAL ELEMENT DRIVING CIRCUIT, ELECTRO-OPTICAL DEVICE, AND ELECTRONIC DEVICE

(75) Inventor: Yojiro Matsueda, Chino (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/445,014

(22) PCT Filed: May 20, 1999

(86) PCT No.: PCT/JP99/02678

§ 371 Date: Dec. 9, 1999

§ 102(e) Date: Dec. 9, 1999

(87) PCT Pub. No.: WO99/60558

PCT Pub. Date: Nov. 25, 1999

(30) Foreign Application Priority Data

May 20, 1998 (JP) .............................. 10-138907

(51) Int. Cl.$^7$ ................................................ G09G 3/36
(52) U.S. Cl. .................. 315/169.1; 315/169.3; 315/169.2; 345/95
(58) Field of Search .................... 315/169.2, 169.1, 315/169.3; 345/87, 89, 95, 96

(56) References Cited

U.S. PATENT DOCUMENTS 5,414,443 A * 5/1995 Kanatani et al. .............. 345/95

FOREIGN PATENT DOCUMENTS

WO     WO96-24123     8/1996

* cited by examiner

Primary Examiner—David Vu
(74) Attorney, Agent, or Firm—Oliff & Berridge, PLC

(57) ABSTRACT

In a driving circuit of an electro-optical device, after a shift register as a digitalprocessing element perform predetermined digital processing to a digital driving signal and generates a processing digital driving signal, a level shifter as a voltage increasing element increases voltage of the processing digital driving signal and generates a voltage-increased digital driving signal. Then, a D/A converter as a digital/analog converting element digital/analog converts the voltage-increased digital driving signal, generates an analog driving signal, and applies the analog driving signal to each electro-optical element. Furthermore, among capacitance elements used for the D/A converter, elements with a large capacitance are formed in a low density wire region in the vicinity of a pixel portion, and elements with small capacitance are formed in a high density wire region which is separated from the pixel portion.

7 Claims, 19 Drawing Sheets

Type A (Vo is constant or |Vc| > |V0|)

Type B (|Vc| < |V0|)

ELECTRO-OPTICAL ELEMENT DRIVING CIRCUIT, ELECTRO-OPTICAL DEVICE, AND ELECTRONIC DEVICE

BACKGROUND OF THE INVENTION

1. Field of the Invention

This invention relates to an electro-optical element driving circuit which drives an electro-optical element in an electro-optical device represented by a display device using an electro-optical substance such as liquid crystal, an electro-optical device using this driving circuit, and an electronic device. More specifically, this invention relates to an electro-optical element driving circuit which is integrally formed with an electro-optical element on the same substrate within an electro-optical device.

2. Description of the Related Art

An electro-optical device which performs display processing or the like using liquid crystal or the like is generally known. In this type of electro-optical device, conventionally, it is common that, an element portion including an electro-optical element which actually performs the display processing or the like and an electro-optical element driving circuit which drives this electro-optical element are individually fabricated and are mutually connected in a final process, thus forming a single electro-optical device. However, in an electro-optical device of this type of structure, after the element portion and the driving circuit which drives the element portion are individually fabricated, a separate process is needed to assemble them together, so there is a problem such that the process of fabricating the device becomes complicated, the cost becomes higher, and the entire electro-optical device becomes larger.

Therefore, integrally fabricating these components can be considered, but in this type of integral structure, if the number of electro-optical elements increases and the element portion is to have a micro-structure, a width of the wiring becomes narrow. Furthermore, arrangement of wires becomes complicated. Because of this, electric power consumption increases, and there is a problem such that the entire electro-optical device becomes larger.

Furthermore, it is desired that a driving circuit be digitally structured, but there are many cases that an electro-optical element is analog-driven. Therefore, if the driving circuit and the element portion are integrally formed, there is a problem such that noise generated from a circuit which performs digital processing leaks into a circuit which performs analog processing, and the electro-optical element cannot be accurately driven.

SUMMARY OF THE INVENTION

This invention reflects upon the above-mentioned problems, and an object of this invention is to provide an electro-optical element driving circuit, an electro-optical device provided with the electro-optical element driving circuit, and an electronic device which accomplish lower electric power consumption and decrease noise. Furthermore, these objects are to be accomplished even while simplifying a fabricating process by integrally forming an element portion including a plurality of electro-optical elements and a driving circuit which drives the respective electro-optical elements, decreasing the cost of the electro-optical device, and making the entire device smaller.

In order to solve the above-mentioned problems, this invention is an electro-optical element driving circuit which drives a plurality of electro-optical elements arranged in matrix. The invention has a plurality of digital processing elements that correspond to respective bits in a digital driving signal for driving each of the electro-optical elements, and which generate a processing digital driving signal by performing predetermined digital processing to the digital driving signal. The invention also has a plurality of voltage increasing elements that increase the voltage of the processing digital driving signals and generate increased voltage digital driving signals. The invention also has a plurality of digital/analog converting elements that generate analog driving signals corresponding to a digital value included in the digital driving signal by digital/analog converting the increased voltage digital driving signal, and drive the respective electro-optical elements by applying the analog driving signals to the respective electro-optical elements.

In this invention, a plurality of digital processing elements corresponding to respective bits of a digital driving signal perform predetermined digital processing to the digital driving signal and generate processed digital driving signals. Then, a plurality of voltage increasing elements increase the voltage of the processing digital driving signals, and generate increased voltage digital driving signals. Furthermore, a plurality of digital/analog converting elements digital/analog convert the increased voltage digital driving signals, generate analog driving signals corresponding to a digital value included in the digital driving signal, and drive the respective electro-optical elements by applying a voltage to each electro-optical element. Therefore, the processing voltage in the digital processing of the input digital driving signal can be lower than the voltage of the analog driving signal such that digital noise can be decreased, and the lower electric power consumption can be achieved for the entire electro-optical element driving circuit.

In this invention, each digital processing elements and each voltage increasing elements are disposed on a substrate such that a digital/analog converting elements is sandwiched between an element portion, on which the plurality of electro-optical elements are disposed, on one side and the substrate on the other side. Each of the digital processing elements, each of the voltage increasing elements, and each of the digital/analog converting elements are disposed in the area that is at a distance equal to an interval of the electro-optical elements from a signal line for supplying the analog driving signal to the electro-optical elements, in a direction perpendicular to the signal line. The digital/analog converting elements are switch-capacitance type digital/analog converting elements which may consist of an analog switch and a capacitance circuit. Among the digital processing elements, the voltage increasing elements, and the capacitance circuit, it is preferable that the capacitance circuit is disposed at a position closest to the element portion.

With this structure, a circuit to perform digital processing and a circuit to perform analog processing are isolated, and all of the circuits are disposed within an area of a distance equal to an interval of the electro-optical element in a direction perpendicular to the signal line, so it is possible to decrease leakage of the noise from the circuit which performs digital processing into the circuit that performs analog processing.

In this invention, each capacitance circuit may consist of a plurality of capacitance elements having capacitances which are mutually different in magnitude, corresponding to the respective digital values. The plurality of capacitance elements are preferably disposed at locations such that the capacitance element having the largest capacitance among all the capacitance elements is closest to the element portion, and as distance from the element portion increases, the capacitance becomes smaller.

With this structure, the capacitance element that occupies the largest area is disposed in an area in which there are the least number of wires, so each element can be disposed by effectively using the area on the substrate without waste.

In this invention, if n is a natural number, among the plurality of capacitance elements, a capacitance element corresponding to an $n^{th}$ bit (n is a natural number) of the digital value is preferably structured by $2^{n-1}$ unit cells.

With this structure, irregularity of the process when a capacitance circuit with a large region is fabricated is considered, and it is possible to prevent accuracy deterioration of the digital/analog converting elements corresponding to each bit of the digital driving signal.

In this invention, each analog switch is preferably structured by a thin film transistor. It is preferable that the channel width of the analog switch corresponding to $n^{th}$ bit of the digital value is $2^{n-1}$ times a predetermined unit channel width.

With this structure, the ratio between the capacitance of the capacitance element for each bit and the channel width of the analog switch becomes constant, and thus a so-called punch-through voltage is constant and accuracy of the analog driving signal can be improved.

In this invention, it is preferable that the capacitance of each capacitance element is smaller than the capacitance it originally should have been with respect to the digital value by the amount of the capacitance between wires received by the capacitance element from wiring on another substrate.

With this structure, because the capacitance of each capacitance element is smaller than the capacitance it originally should have been with respect to the digital value by the amount of the capacitance between wires received by the capacitance element from wiring on another substrate, it is possible to prevent accuracy of the analog driving signal from deteriorating as the apparent capacitance of the respective capacitance elements increases due to the effect of the capacitance between wires.

In this invention, it is preferable that, on the substrate, a plurality of element which respectively form each digital processing elements, each voltage increasing element, each analog switch and each capacitance circuit are arrayed and disposed for each bit in a direction in which the signal lines are disposed, and further that wires among the plurality of wires connected between the respective elements that are parallel to the signal lines are mutually separated on the substrate, as seen from a plan view.

With this structure, because a so-called cross-over surface area of wires is minimized, there is no parasitic capacitance between wires. Therefore, lower electric power consumption can be achieved, and yield can be improved by preventing shorts during the fabricating process In this invention, it is preferable that, among a plurality of the wires parallel to the signal line, wires which are formed between different layers in multi-layer wiring are alternately arrayed and formed in a direction perpendicular to the signal lines. That is, if each wiring goes through a different interlayer insulating film, it is preferable that parallel wires are formed so as to not overlap each other, as seen from a plan view.

With this structure, wires which extend in parallel sandwich an interlayer insulating film and do not overlap each other, such that even if each element is closely disposed within a specified region, it is possible to prevent parasitic capacitance between wires. Thus, even lower electric power consumption can be achieved.

If an electro-optical device provided with an element portion where a plurality of electro-optical elements are disposed in a matrix is structured by using an electro-optical element driving circuit that incorporates this invention, the electro-optical device can be made smaller, accuracy can be improved, and lower electric power consumption can be achieved.

In this invention, by using a liquid crystal display element as the electro-optical element, a liquid crystal device can be smaller, accuracy can be improved, and lower electric power consumption can be achieved.

By installing this type of electro-optical device in an electronic device, the electronic device can be made to be smaller, accuracy can be improved, and lower electric power consumption can be achieved.

DETAILED DESCRIPTION OF THE PREFERRED EMBODIMENTS

The following explains preferred embodiments of this invention, based upon the drawings.
(Overall Structure of the Electro-Optical Device)

Figure 1:
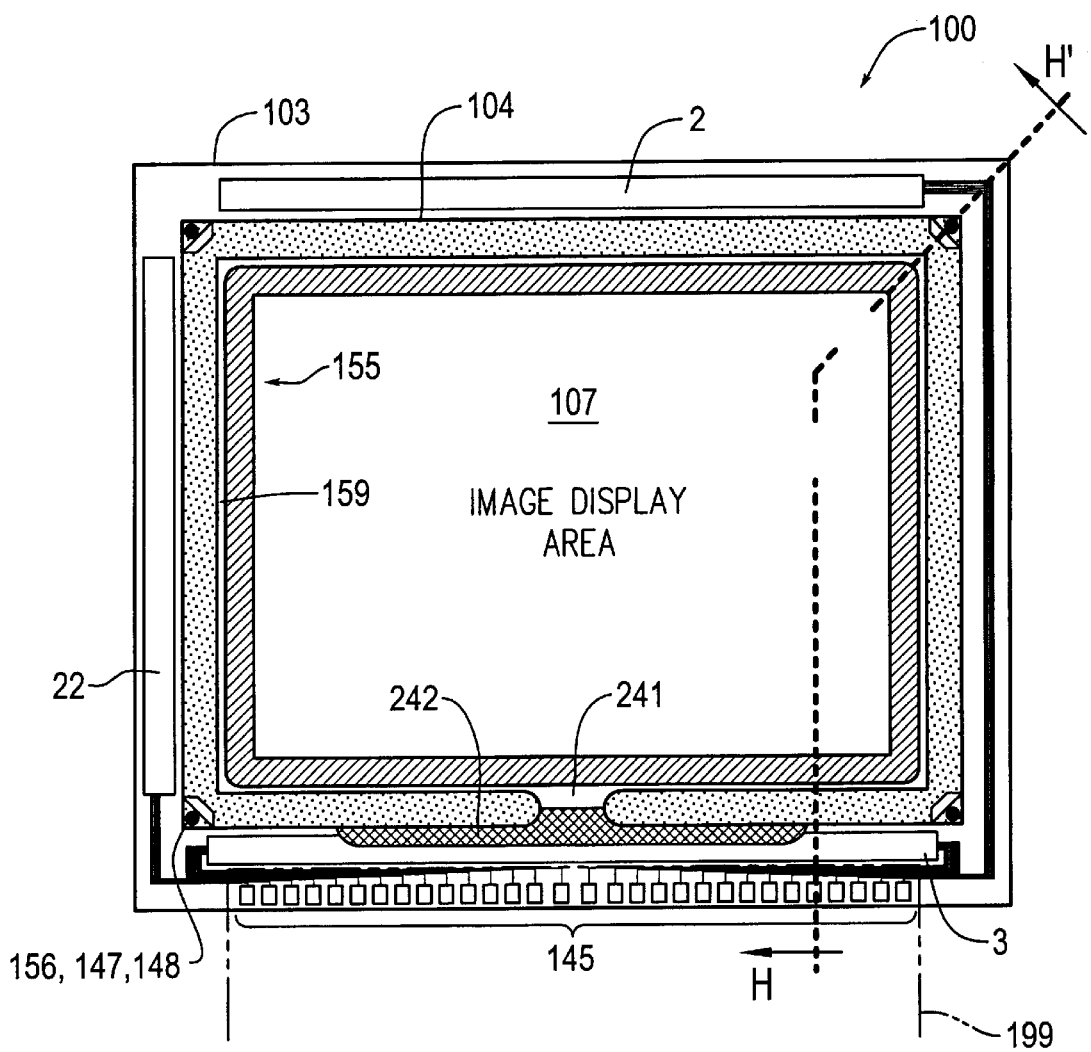
FIG. 1 is a plan view of an electro-optical device to which this invention is applied, as seen from an opposing substrate side.
Figure 2:
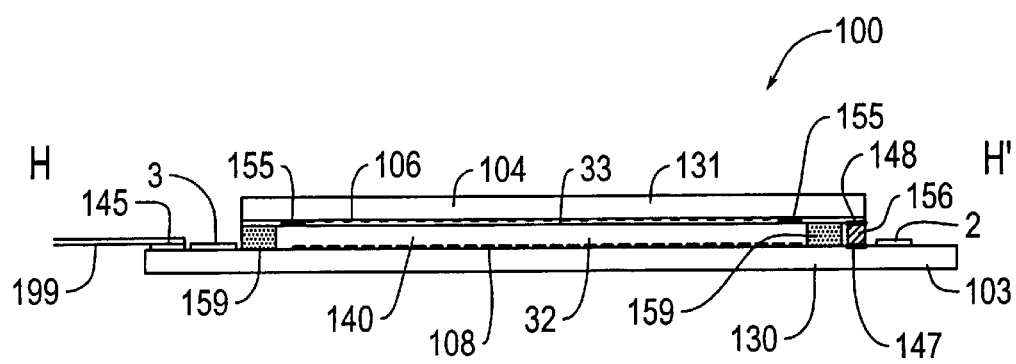
FIG. 2 is a cross-sectional view when the electro-optical device shown in FIG. 1 is cut along line H–H' of FIG. 1.

FIG. 1 is a plan view of an electro-optical device to which this invention is applied, as seen from an opposing substrate side. FIG. 2 is a cross-sectional view when the electro-optical device shown in FIG. 1 is cut along line H–H' of FIG. 1.

As shown in FIGS. 1 and 2, an electro-optical device 100 which is used for a projection display device or the like is schematically structured by an active matrix substrate 103 in which pixel electrodes 108 are formed in a matrix on a surface of a substrate 130 such as quartz glass or heat resistant glass, an opposing substrate 104 in which opposing electrodes 33 are formed on a surface of a substrate 131 such as quartz glass or heat resistant glass in the same manner, and a liquid crystal 32 which is filled in between these substrates as an electro-optical substance. In this embodiment, a transparent electrode such as ITO (Indium Tin Oxide) film or the like is used for the pixel electrodes 108 with an object of forming a transparent type electro-optical device 100, but if the pixel electrodes 108 are formed by a metal film such as an aluminum film, a reflective type electro-optical device 100 can be formed.

In the electro-optical device 100 of this embodiment, the active matrix substrate 103 and the opposing substrate 104 are attached at a specified spacing by a seal member 159 including a gapping member formed along the circumference of the opposing substrate 104. Additionally, between the active matrix substrate 103 and the opposing substrate 104, a liquid crystal filling region 140 is dividingly formed by the seal member 159, and the liquid crystal 32 is filled within the liquid crystal filling region 140.

The opposing substrate 104 is smaller than the active matrix substrate 103, and the two are aligned such that the peripheral portion of the active matrix substrate 103 protrudes beyond the circumference of the opposing substrate 104. Therefore, the driving circuits of the active matrix substrate 103 (scanning line driving circuit 22, odd number data line driving circuit 2, and even number data line driving circuit 3) and an input/output terminal 145 are in a state in which they are exposed from the opposing substrate 104. Because the seal member 159 is partially disconnected, a liquid crystal inlet 241 is formed by this disconnected portion. Because of this, after the opposing substrate 104 and the active matrix substrate 103 are attached, if the internal region of the seal member 159 is made to be in a low pressure state, the liquid crystal 32 can be low-pressure guided from the liquid crystal inlet 241, and after injecting the liquid crystal 32, the liquid crystal inlet 241 can be filled by filling agent 242. Additionally, in the active matrix substrate 103, inside of the formation region of the seal member 159, a shielding film 155 is formed to separate an image display area 107. Furthermore, on the opposing substrate 104, a shielding film 106 is formed in a region corresponding to a boundary of each pixel electrode 108 of the active matrix substrate 103.

In the electro-optical device 100 which is thus structured, in the active matrix substrate 103, an orientation state of the liquid crystal 32 is controlled for each pixel between the pixel electrode 108 and the opposing electrode 33 by a driving signal applied to the pixel electrode 108 through a data line (not depicted) and a thin film transistor (not depicted) for pixel switching, and a specified image is displayed. Therefore, in the active matrix substrate 103, as a driving signal is supplied to a pixel electrode 108 through a data line and a thin film transistor for pixel switching, it is necessary to apply a specified electric potential to the opposing electrode 33. Therefore, in the electro-optical device 100, upper/lower continuity electrodes 147 formed of an aluminum film are formed by employing a formation process of the data lines or the like on portions of the surface of the active matrix substrate 103 opposite to each corner of the opposing substrate 104. At each corner portion of the opposing substrate 4, an upper/lower continuity electrode 148 formed of an ITO film is formed by employing a formation process of the opposing electrode 33. Additionally, the upper/lower continuity electrodes 147 and 148 are electrically conducted by a conductive material 156 in which conductive grains such as silver powder or gold metal plated fiber are blended into an adhesive component of an epoxy resin system. Because of this, in the electro-optical device 100, even without connecting a flexible wire substrate or the like to the active matrix substrate 103 and the opposing substrate 104, respectively, specified signals and electric potential can be input to both the active matrix substrate 103 and the opposing substrate 104 merely by connecting a flexible wire substrate 199 to the active matrix substrate 103.

In the example shown here, the scanning line driving circuit 22 is formed on only one side along an image display region 107, but it can be formed on both sides of the image display region 107 along two edges of the image display region 107 which are opposite to each other. Furthermore, the data line driving circuit is formed as an odd number data line driving circuit 2 and an even number data line driving circuit 3 on both sides along two edges of the image display region 107 which are opposite to each other, but can be formed on only one side along an edge of the image display region 107.

(Structure of the Pixel Portion)

Figure 3A:
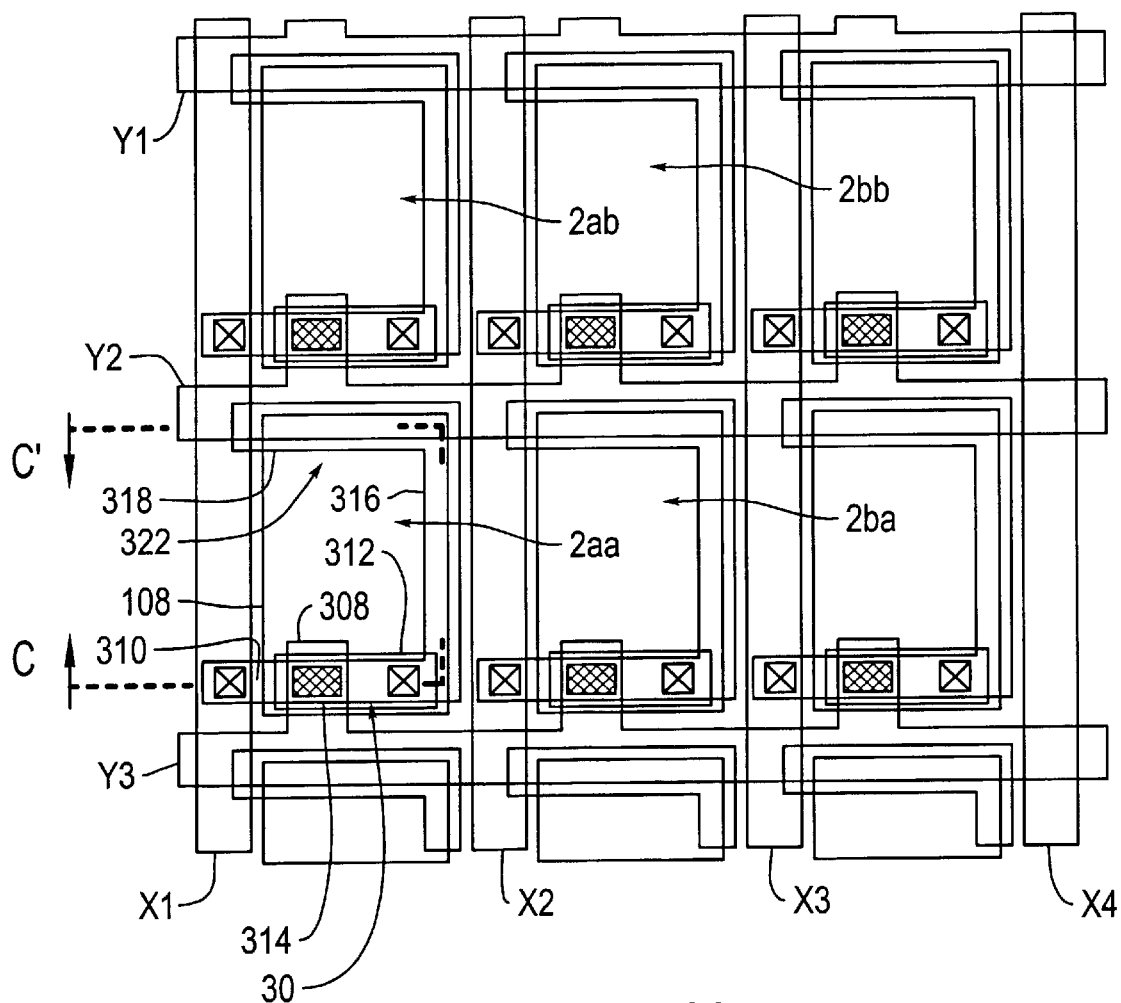
FIG. 3(a) is a plan view showing a portion of pixels formed in a matrix on an active matrix substrate which is used for the electro-optical device shown in FIG. 1.
Figure 3B:
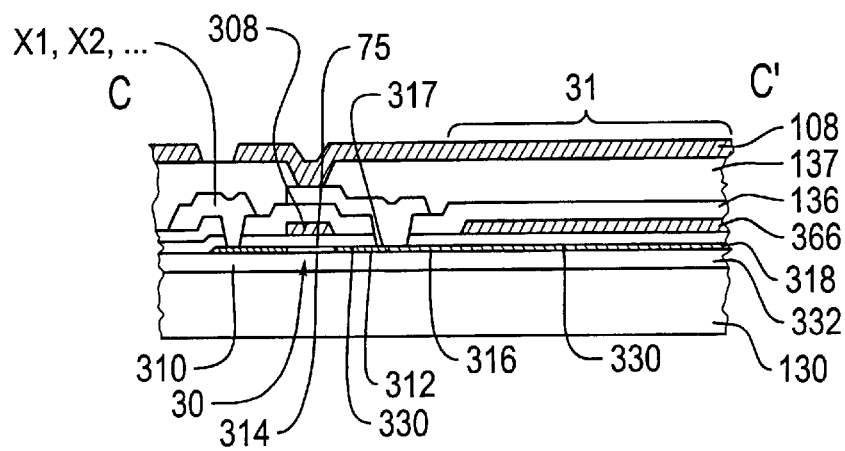
FIG. 3(b) is a cross-sectional view along line C–C' of FIG. 3(a).

In the active matrix substrate 103 used in the electro-optical device 100, in a portion corresponding to the image display region 107, a plurality of pixels are formed in a matrix. The structure of the pixels is explained with reference to FIGS. 3(a) and (b). FIG. 3(a) is a plan view of one pixel formed in an image display region 107 and the adjacent pixels, and FIG. 3(b) is a cross-sectional view schematically showing a state in which the pixel of FIG. 3(a) is cut along line C–C'.

As shown in FIGS. 3(a) and (b), in the image display region 107 of the electro-optical device 100, data lines X1, X2, X3 . . . extending in one direction and scanning lines Y1, Y2, Y3 . . . extending in a direction crossing these data lines X1, X2, X3 . . . are formed in a grid state, and between these signal lines, pixels 2aa, 2ab, 2ba, . . . are formed at dimensions of, for example, 50 μm×55 μm. In these pixels 2aa, 2ab, 2ba, . . . a thin film transistor 30 for pixel switching, a pixel electrode 108 connected to the thin film transistor 30, and an accumulating capacitor 31 are formed.

The gate electrodes 308 of the thin film transistor 30 are part of corresponding scanning lines Y1, Y2, Y3, . . . Source regions 310 are connected to corresponding data lines X1, X2, X3 . . . A drain region 312 is connected to a pixel electrode 108. The drain region 312 is connected to a lower electrode 318 through a connecting portion 316 of the accumulating capacitor 31. In the source region 310, the drain region 312, and the boundary region 317 between the drain region 312 and the connecting portion 316, an n-type impurity is introduced. Furthermore, an impurity of the same conductive type as in the drain region 312, but with a different density, is introduced to the lower electrode 318 and the connecting portion 316. Therefore, there is a condition in which, in the boundary region 317 between the drain region 312 and the lower electrode 318, impurities of the same conductive type are guided twice. In this example shown here, the upper electrode 336 of the accumulating capacitor 31 is structured by a front scanning line of the scanning lines connected to the thin film transistor 30, but the accumulating capacitor 31 can use a special capacitance line as the upper electrode 336 for the accumulating capacitor 31 as explained with reference to FIG. 4.

Furthermore, in pixel 2aa, a pixel electrode 108 formed of an ITO is formed over substantially the entire surface and connected to the drain region 312 of the thin film transistor 30 through a contact hole.

In the electro-optical device 100 which is thus structured, when the thin film transistor 30 is turned on by a scanning signal which is applied to a gate electrode 308 via the scanning lines Y1, Y2, Y3 . . . , a driving signal (data signal corresponding to an image to be displayed) which is applied to the source region 310 via the data lines X1, X2, X3, . . . is transmitted to the drain region 312 through a channel region 314 formed directly below the gate electrode 308, and the driving signal is applied to the pixel electrode 108 from the drain region 312.

Furthermore, the driving signal which is transmitted to the drain region 312 is transmitted to the accumulating capacitor 31 including the lower electrode 318 through the connecting portion 316, and charge is accumulated within the accumulating capacitor 31 by so doing. Furthermore, after the application of the driving signal is completed, as the accumulated charge continues to be applied to the pixel electrode 108, driving of the liquid crystal corresponding to the pixel portion 2aa is continued.

(Overall Structure of the Electro-optical Device)

The overall structure of the electro-optical device of this embodiment is explained with reference to FIG. 4.

Figure 4:
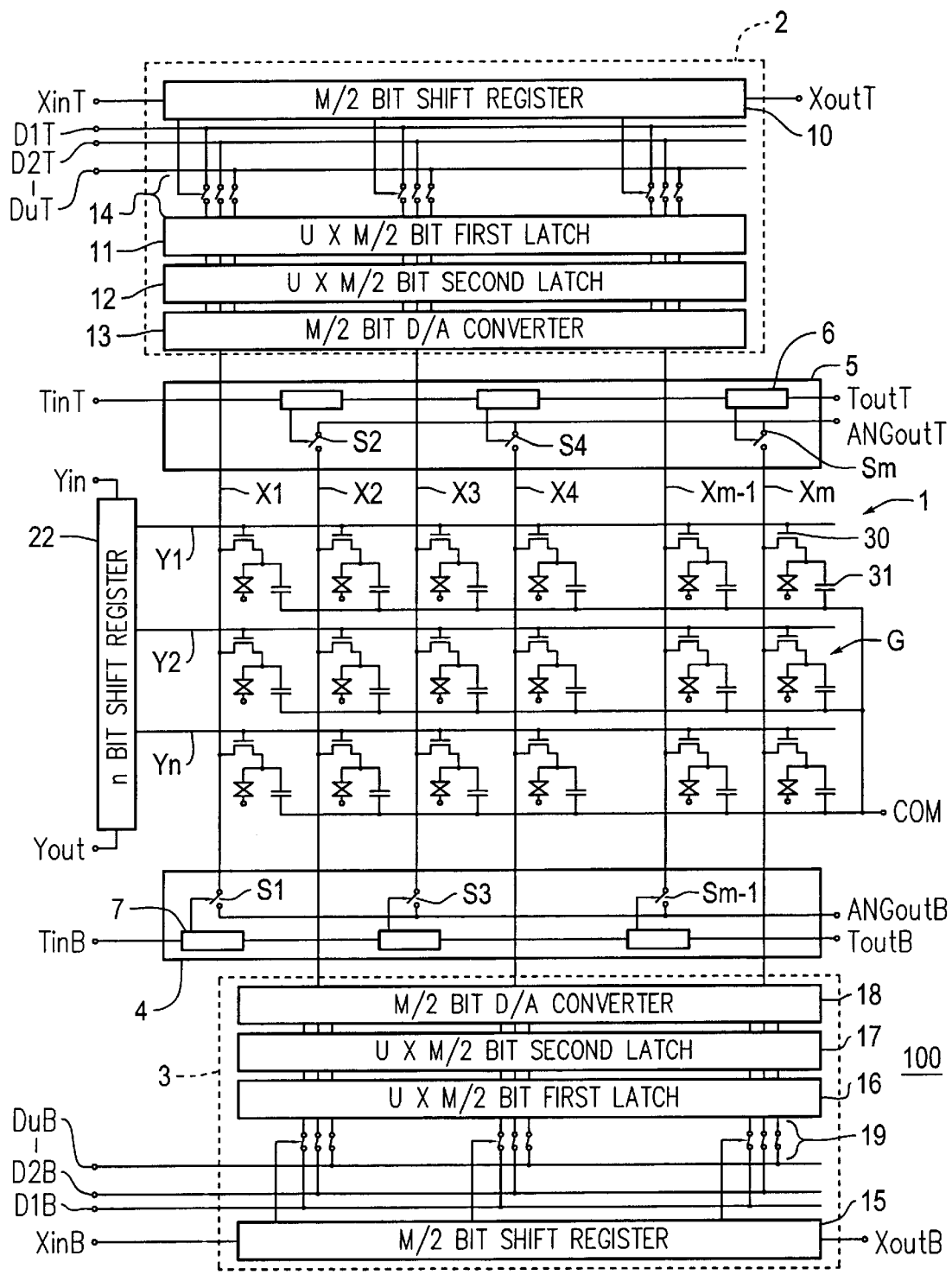
FIG. 4 is a block diagram showing a schematic structure of the electro-optical device shown in FIG. 1.

As shown in FIG. 4, the electro-optical device 100 of this embodiment is constituted by an element portion 1, including pixels G (pixels 2aa, 2ab, . . . in FIG. 3(a)) arranged in an m×n matrix, an odd number data line driving circuit 2, an even number data line driving circuit 3, an odd number data line testing circuit 4, an even number data line testing circuit 5, and a scanning line driving circuit 22 formed of a shift register.

The element portion 1 is constituted by data lines X1, X2, X3, . . . , Xm, scanning lines Y1, Y2, . . . , Yn, and the above-mentioned pixels G that are formed in correspondence to points at which the respective data lines and scan lines cross each other.

As mentioned earlier, each pixel G is constituted by a thin film transistor 30 for pixel switching, an accumulating capacitor 31, the liquid crystal 32 as an electro-optical substance, and the opposing electrode 33. Here, the gate, source, and drain of the thin film transistor 30 are connected to corresponding scanning lines Y1–Yn, corresponding data lines X1–Xm, and pixel electrodes (not depicted), respectively. Furthermore, the drain of the thin film transistor 30 for pixel switching is connected to a corresponding accumulating capacitor 31. Thus, in this embodiment, the electro-optical element (liquid crystal display element) is structured, and these electro-optical elements are driven by an electro-optical element driving circuit formed of an odd number data line driving circuit 2 and an even number data line driving circuit 3 which will be explained as follows.

(Structure of the Electro-Optical Element Driving Circuit)

In the electro-optical element driving circuit, the odd number data line driving circuit 2 is constituted by a shift register 10 as a digital processing element, u bits of input lines D1T–DuT, transmission gates 14 connected to the data input lines D1T–DuT, respectively, a first latch 11, a second latch 12, and a D/A converter 13 as a digital/analog (hereafter referred to as D/A) converting element. The D/A converter 13 has a so-called output off function (function which maintains the output terminal at a high impedance state) in order to perform test processing in the odd number data line testing circuit 4.

The even number data line driving circuit 3 is constituted by a shift register 15 as a digital processing elements, u bits of data inputting lines D1B–DuB, transmission gates 19 connected to the data inputting lines D1B–DuB, respectively, a first latch 16, a second latch 17, and a D/A converter 18 as aD/A converting elements. This D/A converter 18 has an output off function in order to perform test processing in the odd number data line testing circuit 5.

Here, the odd number data line driving circuit 2 is a driving circuit to supply a data signal to odd number data lines X1, X3, . . . Xm−1. The even number data line driving circuit 3 is a driving circuit to supply a data signal to even number data lines X2, X4, . . . Xm.

The odd number data line testing circuit 4 is provided with a switch opening/closing control circuit 7 corresponding to respective odd numbered data lines, and analog switches S1, S3, . . . , Sm−1.

The even number data line testing circuit 5 is provided with a switch opening/closing control circuit 6 corresponding to respective even numbered data lines, and analog switches S2, S4, . . . , Sm.

(Summary of the Operation of the Driving Circuits)

Summary of the operation of the driving circuits which are thus structured will be explained. Furthermore, the operation of the even number data line driving circuit 3 is basically the same as that of the odd number data line driving circuit 2, and the operation of the even number data line testing circuit 5 is basically the same as that of the odd number data line testing circuit 4, and thus the following explains the operation of the odd number data line driving circuit 2 and the odd number data line testing circuit 4.

First, the scanning line driving circuit 22 formed of a shift register sequentially applies scanning signals to the respective scanning lines Y1, Y2, . . . , Yn at a specified predetermined timing, based upon a power source voltage input from outside and a clock signal.

Meanwhile, the odd number data line driving circuit 2 performs digital processing, which will be described later, to an image signal (digital driving signal) corresponding to an image to be displayed which is input from outside through the data input lines D1T–DuT, based upon the power source voltage input from outside and the clock signal. The odd number data line driving circuit 2 also inputs a data signal (analog driving signal), corresponding to the image signal, to the odd numbered data lines X1, X3, . . . , Xn−1 in correlation with the timing at which a scanning signal is applied to the respective scanning lines Y1, Y2, . . . , Yn.

Furthermore, the thin film transistors 30 for pixel switching within the pixels G corresponding to the odd numbered data lines X1, X2, . . . , Xm−1 to which the scanning signal and the data signal are applied, respectively, are turned on during the period in which the scanning signal is applied to the gate electrodes. When a data signal is applied to a source electrode during the period, the applied data signal is applied to a pixel electrode 108 (see FIG. 3) and the accumulating capacitor 31 via the drain electrode, the corresponding liquid crystal 32 is driven, and an image corresponding to the data signal is displayed.

At this time, a constant voltage is applied from a driving circuit, which is not depicted, to the opposing electrode 33.

Furthermore, during manufacturing or the like of the electro-optical device 100, the odd number data line testing circuit 4 applies a testing signal that is input from outside through the switch opening/closing control circuit 7 and the analog switch S1, S3, . . . , Sm−1 to the odd numbered data lines X1, X2, . . . , Xm−1.

In the operation explained above, a shift register 10 within the odd number data line driving circuit 2 samples the image signal for the respective data lines X1, X3 . . . , Xm−1, based upon a clock signal input from outside and outputs a sampling driving signal to each transmission gate 14.

Furthermore, each transmission gate 14 samples the image signal for each data line X1, X3, . . . , Xm−1 and outputs each image signal as a processed digital driving signal to the first latch 11.

Next, the first latch 11 latches the sampled image signal for a pixel line and outputs the image signal through a latch pulse, which will be described later, to a second latch 12.

After that, the second latch 12 latches the image signal again and outputs the image signal to a D/A converter 13 at a specified timing.

Furthermore, the D/A converter 13 converts each image signal to a data signal (analog driving signal) which is an analog signal with a voltage corresponding to the digital value of the data signal, and outputs the data signals to the respective data lines X1, X3, . . . Xm−1.

Thus, the corresponding liquid crystal 32 is driven via the thin film transistor 30 within each pixel G by the data signal and the scanning signal, and display of the image corresponding to the image signal is performed.

Additionally, the operation of the even number data line driving circuit 3 performs the same operation as in the odd number data line driving circuit 2 described above, and the data signal corresponding to the input image signal is applied to the even number data lines X2, X4, . . . , Xm.

(Detailed Description of the Driving Circuit)

Figure 5:
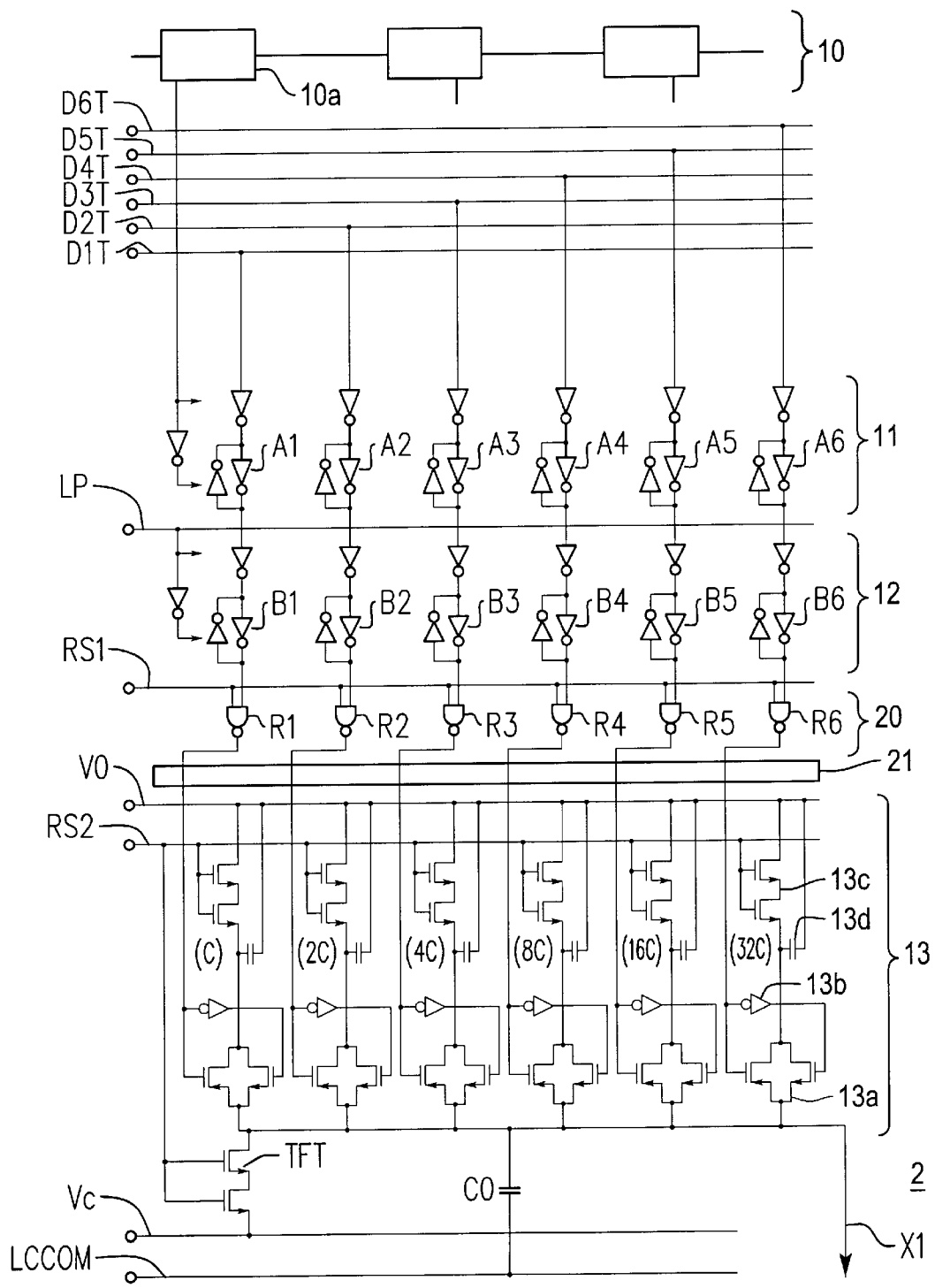
FIG. 5 is a circuit diagram showing a schematic structure of the data line driving circuit shown in FIG. 4.

The following explains a detailed structure of an odd number data line driving circuit 2 related to this invention with reference to FIG. 5.

FIG. 5 is a circuit diagram schematically showing a structural example of the data line driving circuit shown in FIG. 4, and is a circuit diagram in which a portion corresponding to one data line (e.g., data line X1) in the odd number data line driving circuit 2 is enlarged.

The circuit shown in FIG. 5 is a 6-bit odd number data line driving circuit 2 in which a 6-bit image signal is input from outside and a corresponding data signal is output to the data line X1. The detailed structure of the even number data line driving circuit 3 is the same as that of the odd number data line driving circuit 2, and thus a detailed description is omitted.

As shown in FIG. 5, the odd number data line driving circuit 2 is constituted by a shift register 10a, among the shift registers 10, that corresponds to the data line X1, six data line input lines D1T–D6T corresponding to each bit of the image signal, a first latch 11 including six pairs of latch circuits A1–A6 (including a clocked gate as the transmission gate 14) corresponding to each bit of the image signal, a signal latch 12 including six latch circuits B1–B6 corresponding to each bit of the image signal, a logic portion 20 including six logic circuits R1–R6 respectively corresponding to the bits of the image signal, a level shifter 21 which is used as a voltage increasing element that increases a voltage level of the output signal (e.g., 5V) from the latch circuit 12 to, for example, 12V and outputs the voltage to a D/A converter 13 that includes six pairs of analog switches 13a, switch circuits 13c, capacitance elements 13d as a capacitance circuit, and inverters 13b, each respectively corresponding to the bits of the image signal.

Figure 9:
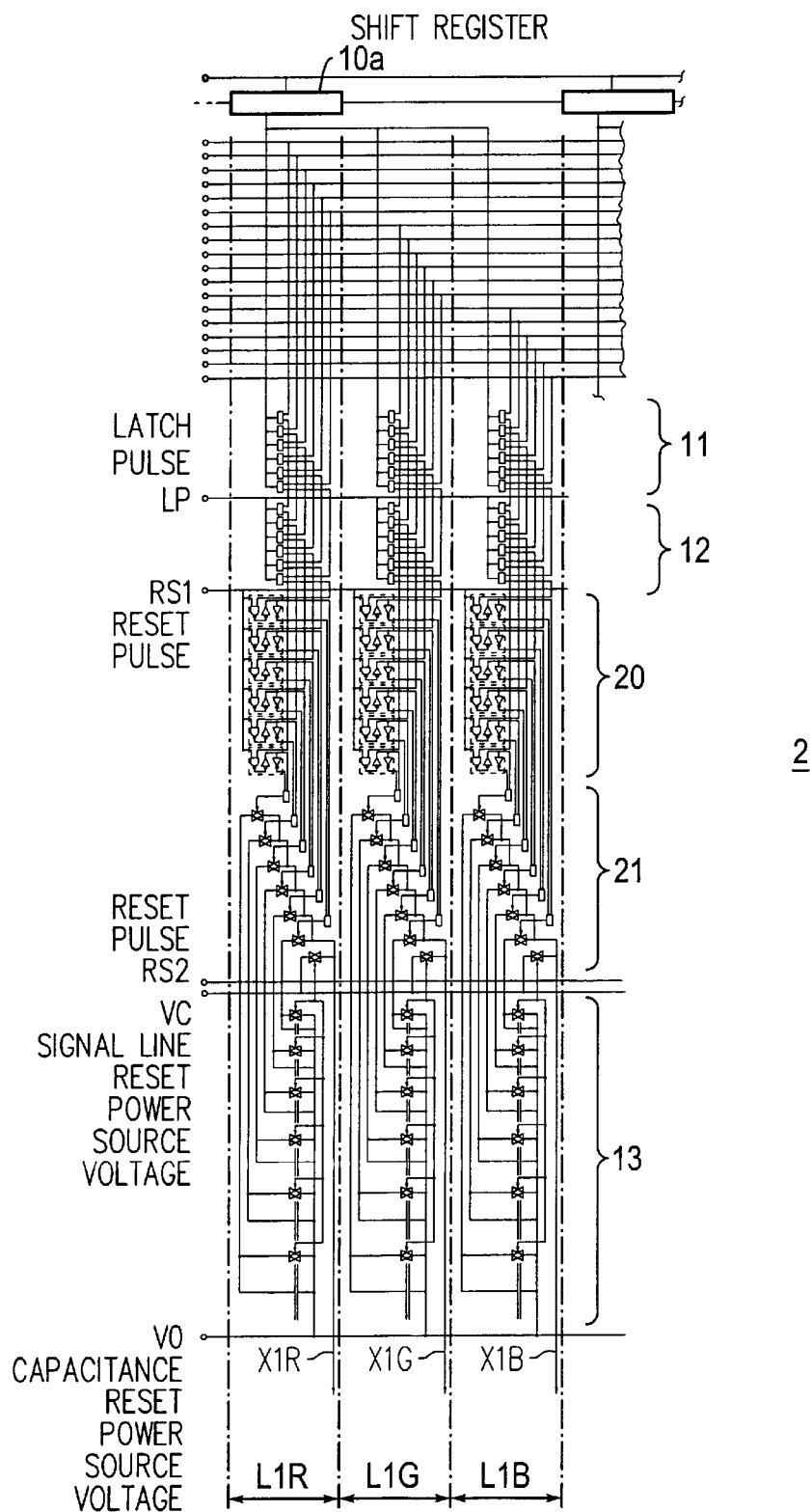
FIG. 9 is a block diagram showing a plan layout of each element which forms the data line driving circuit shown in FIG. 5.
Figure 10:
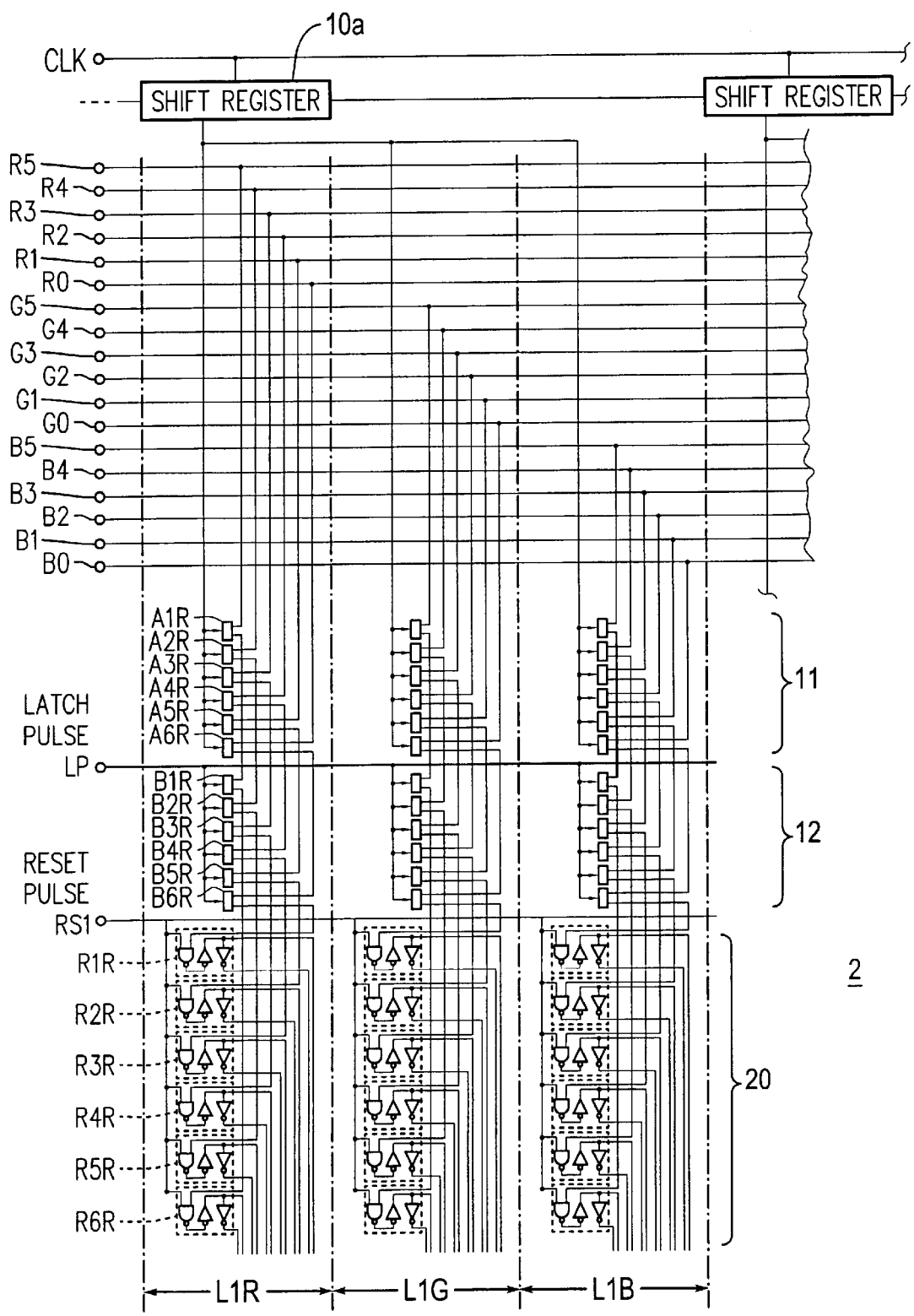
FIG. 10 is a block diagram showing a plan layout of respective elements of the data line driving circuit shown in FIG. 9, with a front portion (input side) enlarged.

In FIG. 5 and FIGS. 9 and 10, which will be discussed later, because the transmission gate 14 shown in FIG. 4 is replaced with a clocked gate, a transmission gate 14 is not depicted in FIGS. 5, 9 and 10.

Here, with respect to each capacitance element 13d, if the capacitance corresponds to each bit of the image signal, and if the capacitance of the capacitance element 13d corresponding to a first bit of the image signal is C, then the capacitance of the capacitance element 13d corresponding to a second bit of the image signal is 2C, the capacitance of the capacitance element 13d corresponding to a third bit of the image signal is 4C, the capacitance of the capacitance element 13d corresponding to a fourth bit of the image signal is 8C, the capacitance of the capacitance element 13d corresponding to a fifth bit of the image signal is 16C, and the capacitance of the capacitance element 13d corresponding to a sixth bit of the image signal is 32C.

Here, the capacitance of each capacitance element 13d takes into consideration the capacitance between wires which each capacitance element 13d receives from other wires, and is thus set to be smaller than each capacitance which should originally have been obtained corresponding to each bit of the image signal by the amount of the capacitance between wires.

Furthermore, with respect to each capacitance element 13d, as described later in detail with reference to FIG. 12, the capacitance element 13d corresponding to an $n^{th}$ ($1 \leq n \leq 6$) bit of the image signal is constituted by a combination of $2^{n-1}$ unit cells.

In a driving circuit which is thus structured, when a 6-bit image signal is input to each circuit, the image signal is sampled by a clocked gate at a specified timing, based upon a sampling driving signal from the shift register 10a. Next, the sampled signal is latched by the first latch 11 and then transferred to the second latch 12 by a latch pulse LP, is latched while being reset by the second latch 12 based upon a reset signal RS1, and is voltage increased by the level shifter 21. A data signal with a voltage corresponding to a digital value in the image signal is generated by the D/A converter 13 and output to the data line X1.

This will be more specifically explained hereafter. First, in the image signal, if the second and fourth bits are "HIGH", as described later, and if the absolute value of the capacitance line reset power source voltage V0 is larger than the absolute value of the signal line reset power source voltage Vc, a data signal with ten times the voltage value output from the analog switch 13a corresponding to the first bit is generated and supplied to the data line X1.

At this time, the D/A converter 13 is reset by a reset pulse RS2 using the capacitance reset power source voltage V0, and the data line X1 is reset by using the signal line reset power source voltage Vc.

Furthermore, each analog switch 13a is constituted by a complimentarily-formed thin film transistor. In this thin film transistor which forms the analog switch 13a, as described later with reference to FIG. 12, the channel width of an analog switch 13a corresponding to an $n^{th}$ bit digital value in the image signal is $2^{n-1}$ times a predetermined unit channel width.

Figure 6:
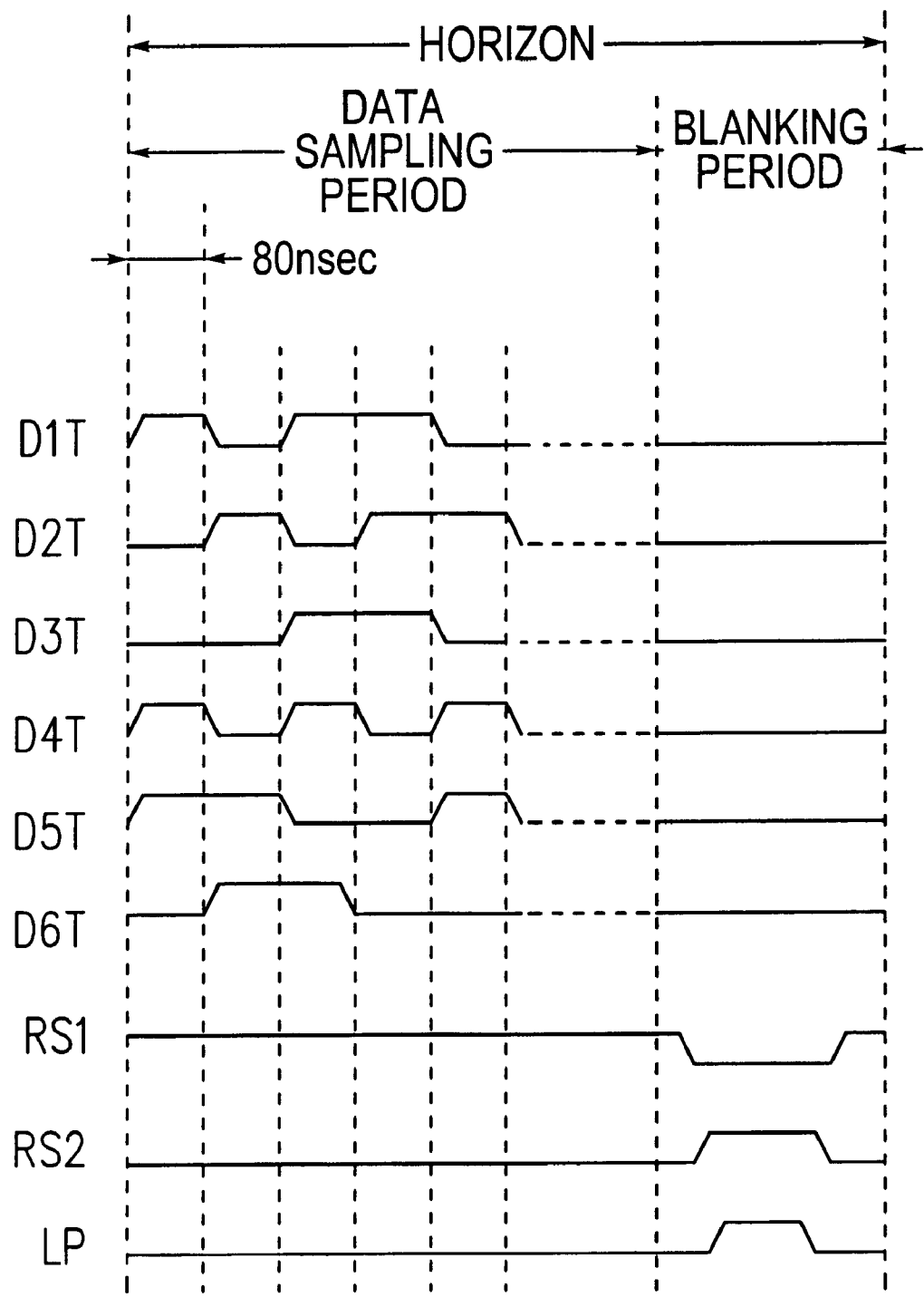
FIG. 6 is an explanatory diagram showing one example of a driving signal wave form processed in the data line driving circuit shown in FIG. 5.

Next, an operation example of the odd number data line driving circuit 2 is explained by using a timing chart shown in FIG. 6. FIG. 6 is an explanatory diagram showing one example of a driving signal wave form processed in the data line driving circuit shown in FIG. 5.

Here, in the electro-optical device 100 shown in FIG. 4, if a data signal is generated in the odd number data line driving circuit 2 shown in FIG. 5, that is, if the odd number data line driving circuit 2 is used for the odd numbered data lines X1, X3, . . . , Xm−1, the even number data line driving circuit 3 is used for the even numbered data lines X2, X4, . . . , Xm, and a data signal is simultaneously applied to each data line from the upper and lower direction, and if the pixel portion 1 is constituted by 640×480 pixels G, one pixel's worth of the data signal is sampled per approximately 80 nsec as shown in FIG. 6.

Additionally, after the data signal is sampled for one line's worth of the pixels G at this timing and latched by the first latch 11, it is transferred to the second latch 12 at the timing at which the latch pulse LP is input.

Figure 7A:
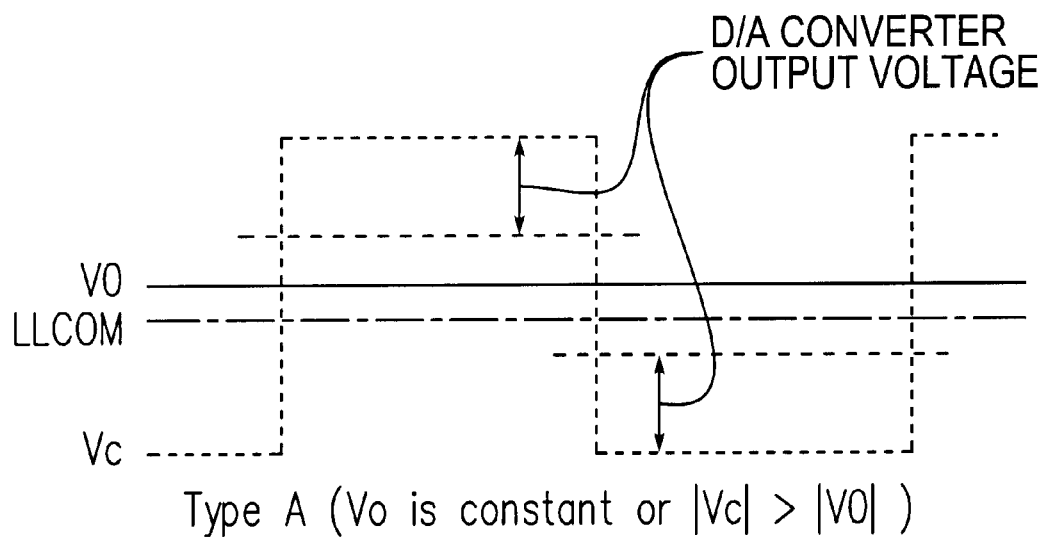
FIGS. 7(a) and (b) are explanatory diagrams each showing an example of a power source wave form of a D/A converter included in the data line driving circuit shown in FIG. 5.
Figure 7B:
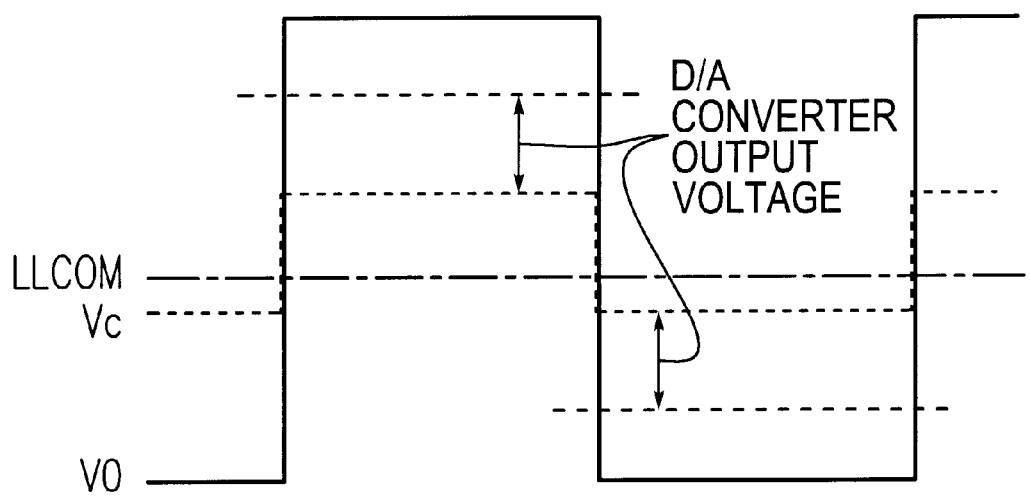
Figure 8:
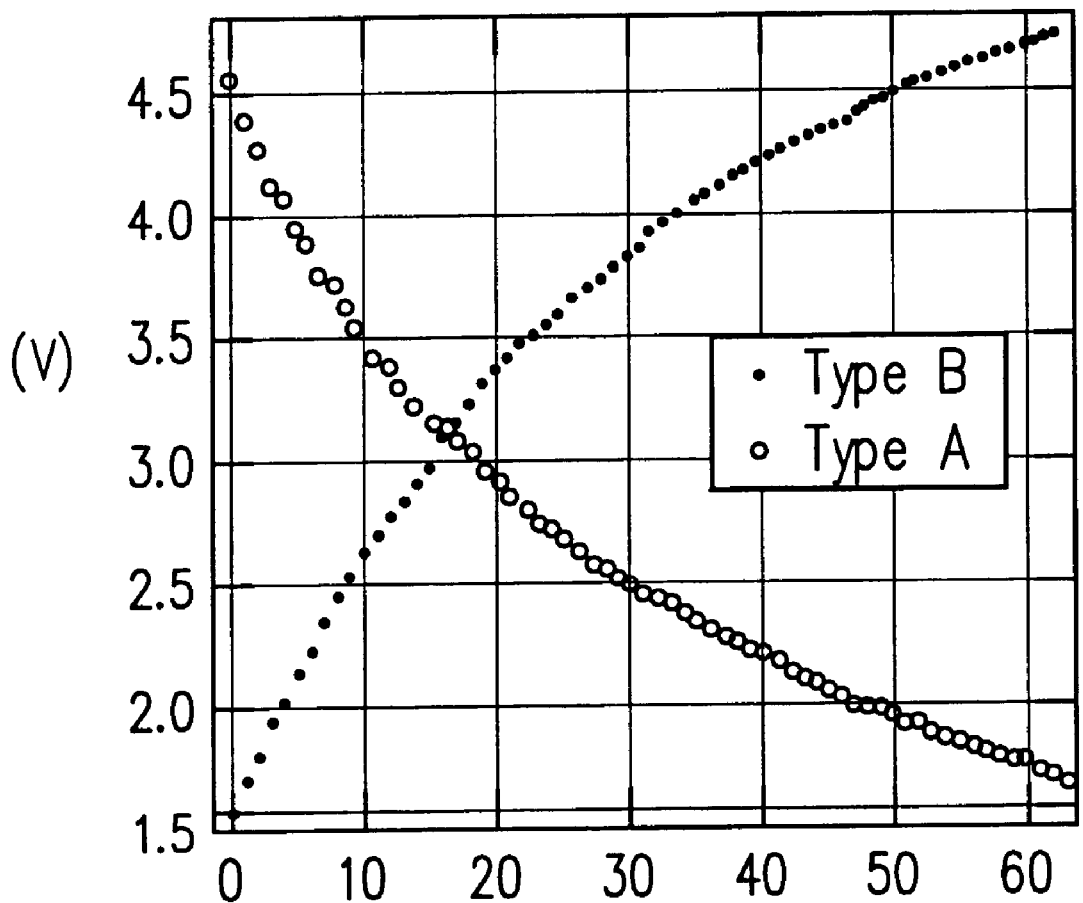
FIG. 8 is a diagram showing a relationship between a digital value of an image signal in the data line driving circuit shown in FIG. 5 and voltage of a data signal.

With reference to FIGS. 7(a), 7(b) and 8, a method of applying a power source to the D/A converter 13 is explained. FIGS. 7(a) and (b) are explanatory diagrams showing one example of a power source wave form of a D/A converter included in the data line driving circuit shown in FIG. 5. FIG. 8 shows a relationship between the voltage of a data signal and a digital value of an image signal in the data line driving circuit shown in FIG. 5.

As described above, a power source voltage for operating the D/A converter 13 is supplied by the signal line reset power source voltage Vc and the capacitance line reset power source voltage V0, but there are two respective methods of supplying the reset power source voltage.

That is, if the capacitance line reset power source voltage V0 is constant, or if the absolute value of the signal line reset power source voltage Vc is larger than the absolute value of the capacitance line reset power source voltage V0, the signal line reset power source voltage Vc is applied at the timing and wave form shown in FIG. 7(a). Furthermore, the actual output voltage from the D/A converter 13 corresponds to each bit value in the image signal, and for example, a voltage value in a region shown by an arrow in FIG. 7(a) is output.

As an actual change in output voltage, for example, as shown in white dots in FIG. 8, in response to the digital value in the image signal, the larger the digital value becomes, the lower the voltage value of the output data signal.

Meanwhile, when the absolute value of the capacitance line reset power source voltage V0 is larger than the absolute value of the signal line reset power source voltage Vc, the signal line reset power source voltage Vc and the capacitance line reset power source voltage V0 are applied in a wave form and at a timing such as is shown in FIG. 7(b). With respect to the actual output voltage from the D/A converter 13, in response to the value of each bit in the image signal, a voltage value in a region shown by an arrow in FIG. 7(b) is output.

As an actual change in the output voltage, for example, as shown in black dots in FIG. 8, in response to the digital value in the image signal, the larger the digital value becomes, the higher the voltage value of the output data signal.

(Layout of the Driving Circuit)

Next, an arrangement example of each pixel where the odd number data line driving circuit 2 described above is actually formed on the same substrate as the element portion I is explained with reference to FIGS. 9–13.

Figure 11:
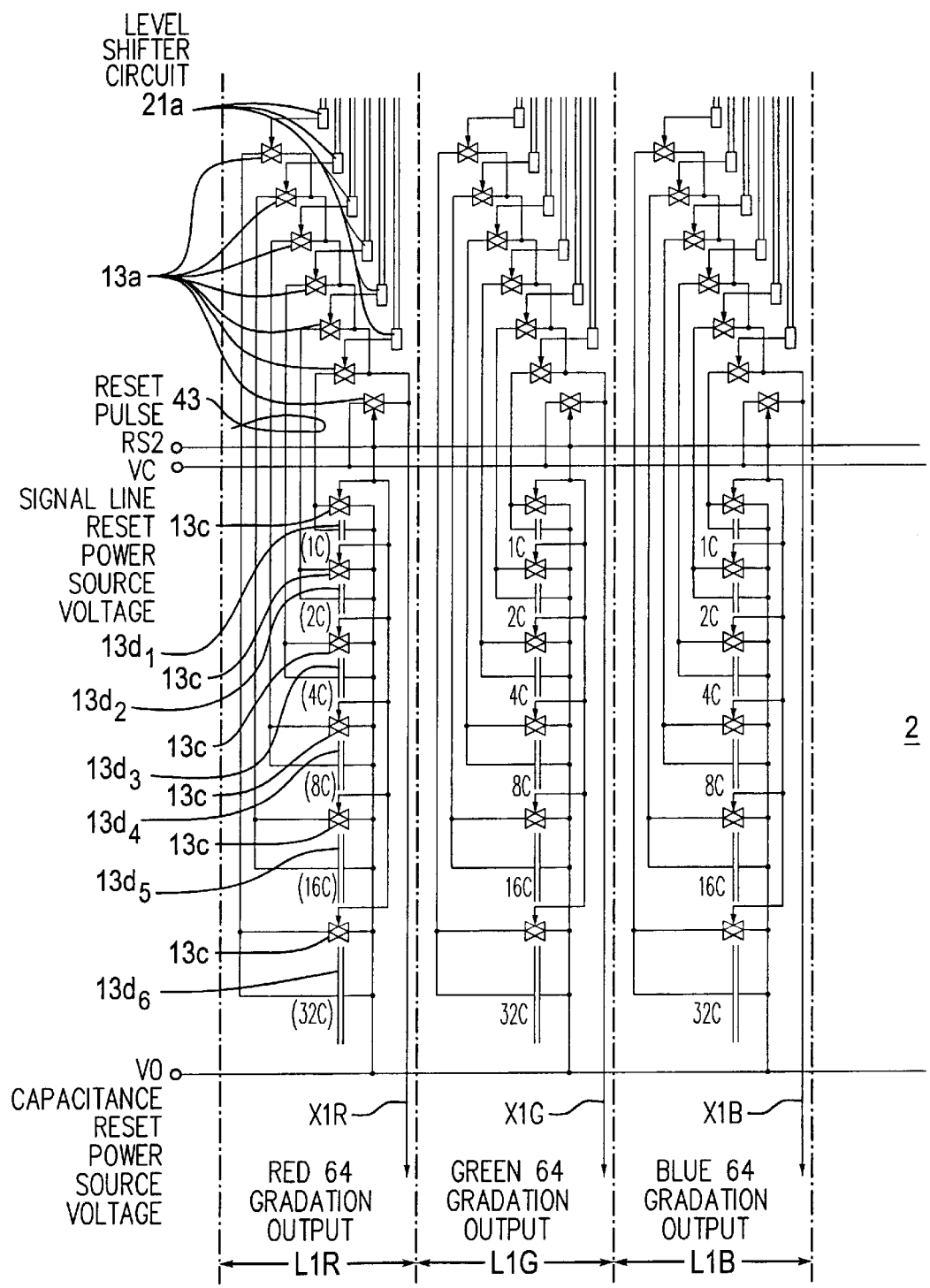
FIG. 11 is a block diagram showing a plan layout of respective elements of the data line driving circuit shown in FIG. 9, with a rear portion (output side) enlarged.

FIG. 9 is a schematic block diagram of a layout of an odd number data line driving circuit 2 formed in a region surrounding the element portion 1. FIG. 10 is a structural diagram of various data input lines (in FIG. 9, these data input lines are described as a data line group), a first latch 11, a second latch 12, and a logic portion 20 in the schematic block diagram shown in FIG. 9. FIG. 11 is a structural diagram of a level shifter 21 and a D/A converter 13 in the schematic block diagram of FIG. 9. FIG. 12 is a plan view of capacitance elements, switching elements, and wiring for these elements in these driving circuits. Furthermore, FIG. 13 is a structural diagram showing a modified example of the layout shown in FIG. 11.

Additionally, explaining with reference to FIGS. 9–11, in the electro-optical device 100 which can display color by grouping the pixels G into respective red pixels, green pixels, and blue pixels, the structure of one pixel is shown when the odd number data line driving circuit 2 is operated by a 6-bit image signal.

The overall arrangement is first explained with reference to FIG. 9. Furthermore, in FIG. 9, the lower direction in the figure is the direction of the element portion 1, and the upper direction in the figure is an edge direction of the electro-optical device 100.

As shown in FIG. 9, in the odd number data line driving circuit 2 of this embodiment, the following elements, listed in order going away from the element portion 1, are each arranged in a longitudinal direction. Namely, a shift register 10a, data input lines R0–R5, G0–G5, B0–B5 for each bit, a first latch 11 per each bit including a clocked gate for each bit, a second latch 12 for each bit, a logic portion 20 for each bit, a level shifter 21 for each bit, and a D/A converter 13 for each bit are arranged.

Here, in FIG. 9, each element to drive a red pixel is formed within a region shown as "L1R", each element to drive a green pixel is formed within a region shown as "L1G", and each element to drive a blue pixel is formed within a region shown as "L1B".

A red data signal (data signal showing 64 red gradations) generated by an element to drive a red pixel is output to a data line X1R, a green data signal (data signal showing 64 green gradations) generated by an element to drive a green pixel is output to a data line X1G, and a blue data signal (data signal showing 64 blue gradations) generated by an element to drive a blue pixel is output to a data line X1B.

Next, with reference to FIG. 10, arrangement of each data input line, the first latch 11, the second latch 12, and the logic portion 20 is explained. Additionally, because the arrangement of the portion related to the green data line X1G and the arrangement of the portion related to the blue data line X1B are the same as in the portion related to the red data line X1R, the following particularly explains the portion related to the red data line X1R.

As shown in FIG. 10, the data input lines R0–R5, G0–G5, and B0–B5 are disposed perpendicular to the respective data line X1R, X1G, and X1B and independently connected to the first latch 11 through respective clocked gates.

Here, the respective latch circuits A1R–A6R which form the first latch 11 are each disposed parallel to the data line X1R, and among the input/output lines for the respective latch circuits A1R–A6R, the signal lines 40 parallel to the data line X1R are disposed so that the signal lines formed in different wire layers do not mutually overlap each other in a plan view.

Next, each output line from the first latch 11 is connected to the second latch 12 so as to cross a signal line into which the latch pulse LP is input.

At this time, the respective latch circuits B1R–B6R which form the second latch 12 are also disposed parallel to the data line X1R, and further, the signal lines 41 parallel to the data line X1R among the input/output lines for each latch circuit B1R–B6R are disposed so that the signal lines formed in different wire layers do not overlap each other in a plan view.

Next, each output line from the second latch 12 is connected to the logic portion 20 so as to cross a signal line into which a reset pulse RS1 is input.

Here, the respective logic circuits R1R, R2R, R3R, R4R, R5R, and R6R are also disposed parallel to the data line X1R, and the signal lines 42 parallel to the data line X1R among the input/output lines for the respective logic circuits R1R–R6R are disposed so that the signal lines formed in different wire layers do not overlap each other in a plan view. That is, in the region through which the signal lines 42 pass, the wires are formed in a condensed configuration, so the signal lines 42 are run using multi-layer wiring. In this case, wires formed between different layers in multi-layer wiring are shifted in a direction perpendicular to the signal lines and mutually aligned, so the signal lines 42 which extend in parallel do not sandwich an interlayer insulating film and overlap each other.

Furthermore, in the logic portion 20 in FIGS. 9 and 10, in order to drive each level shifter 21a, which will be discussed later, supplementing the NAND gates shown in FIG. 10, two inverters are included in addition to the NAND gate (R1–R6 shown in FIG. 5) per each logic circuit.

Figure 12:
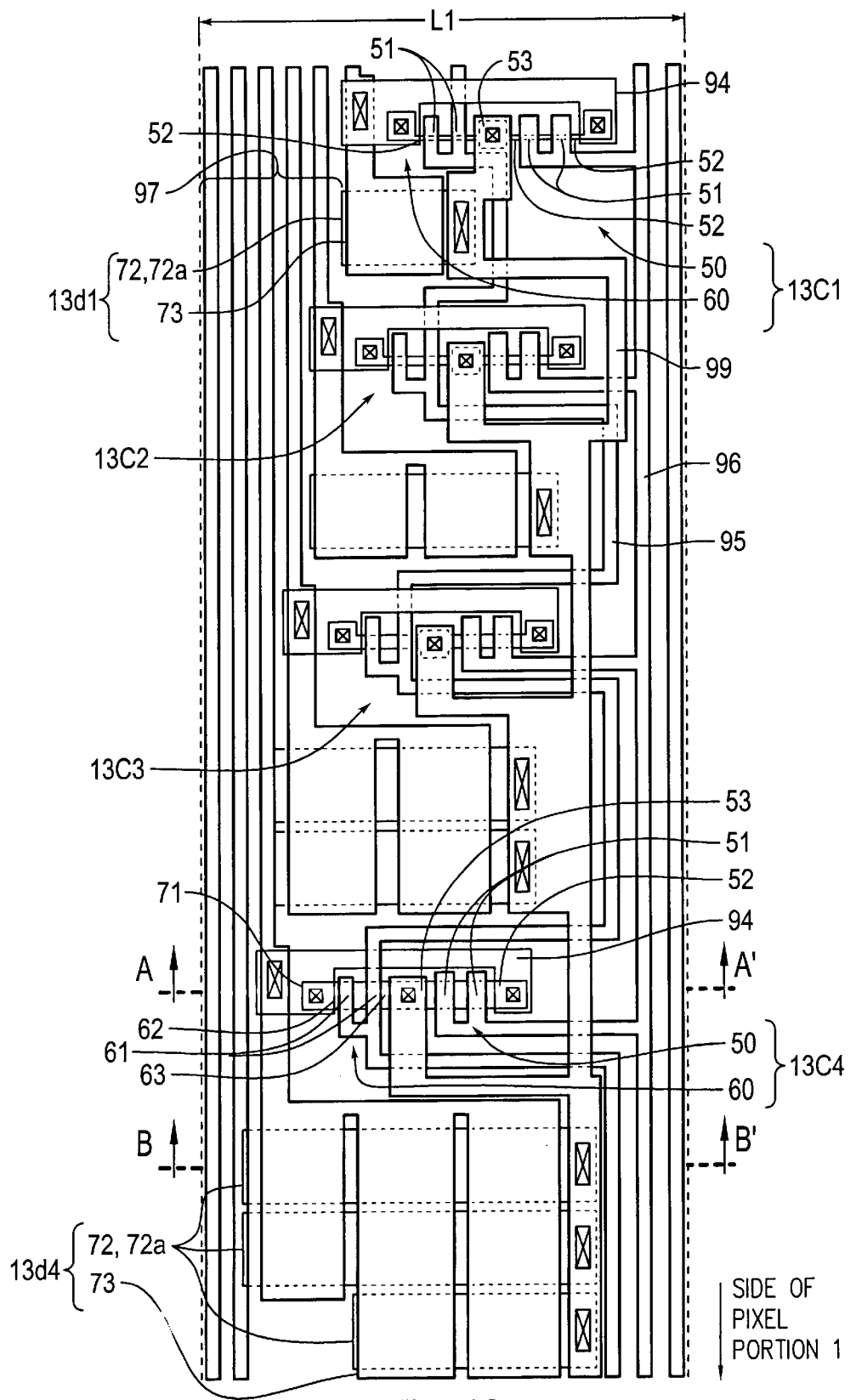
FIG. 12 is a plan view of capacitance elements, switch elements, and a wire pattern which form a D/A converter included in the data line driving circuit shown in FIG. 11.

Next, with reference to FIGS. 11 and 12, arrangement of each element within the level shifter 21 and the D/A converter 13 is explained. Furthermore, the following explains the portion particularly related to the red data line X1R in the same manner as in FIG. 10.

As shown in FIG. 11, the output lines from the logic portion 20 are connected to respective level shifter circuits 21a which structure the level shifter 20 per bit.

Here, the level shifter circuit 21a for each bit is arranged slightly diagonally with respect to the red data line X1R, and is connected to the gate electrode of each analog switch 13a per bit, also diagonally arranged.

The source electrode lines 43 of the respective analog switches 13a are disposed parallel to the red data line X1R so as to cross the signal line into which the reset pulse RS2 is input and the signal line into which the signal line reset power source voltage Vc is input, and the respective source electrode line 43 of each analog switch 13a is connected to one terminal of a respective capacitance element 13d and a respective switch circuit 13c for each bit.

Furthermore, the other end of these capacitance elements 13d is connected to the red data line X1R via the analog switches 13a and the switch circuits 13c.

Furthermore, the ON/OFF of each analog switch 13a is controlled by the reset pulse RS2, and voltage from each capacitance element is supplied to the red data line X1R.

Furthermore, each element corresponding to the green and blue pixels is disposed parallel to corresponding data lines X1G and X1B in the same manner as in the case of the red pixels described above.

Here, in FIGS. 10 and 11, the width of each region shown at "L1R", "L1G", and "L1B" can be the same as, for example, the pitch of each pixel (red, green, and blue pixels) in the element portion 1, or if each pixel G within the element portion 1 is simultaneously driven by the odd number data line driving circuit 2 and the even number data line driving circuit 3, as in this embodiment, the width can be twice the pitch of each pixel in the element portion 1.

(Detailed Description of the D/A Converter)

Next, with reference to FIGS. 11 and 12, the arrangement of each capacitance element 13d within the D/A converter 13 is explained.

As shown in FIGS. 11 and 12, within the D/A converter 13, analog switches 13a, capacitance elements 13d, and switch circuits 13c are formed. Depending on which combination of one or more of the capacitance elements 13d is charged, a digital signal is converted to an analog signal and output from each analog switch 13a.

Figure 13A:
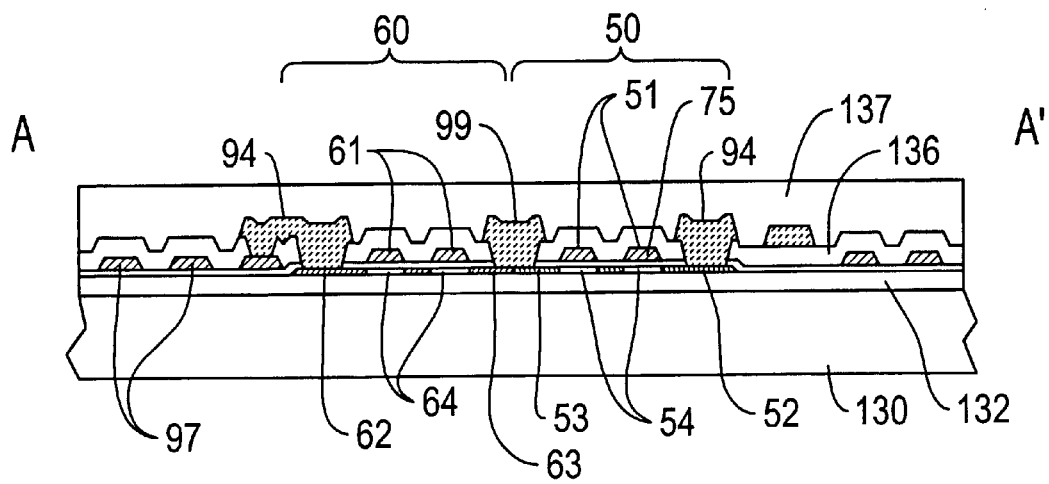
FIG. 13(a) is a cross-sectional view along line A–A' of FIG. 12.
Figure 13B:
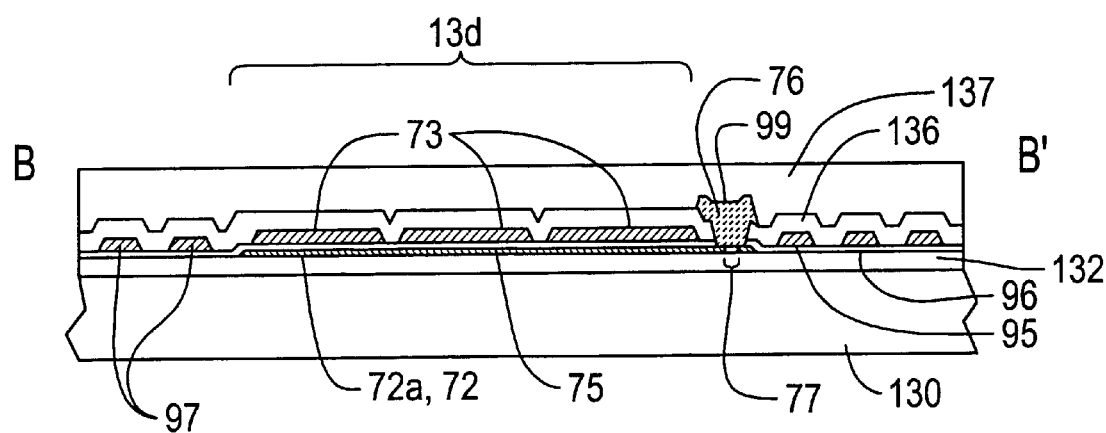
FIG. 13(b) is a cross-sectional view along line B–B' of FIG. 12.

The analog switches 13a and the switch circuits 13c shown in FIGS. 11 and 12 are constituted by N-channel type thin film transistors and P-channel type thin film transistors which are complementarily connected. In FIGS. 12, 13(a) and (b), along with the capacitance elements 13d, an N-channel type thin film transistor 50 and a P-channel type thin film transistor 60 which form the switch circuits 13c are shown.

As seen from FIGS. 12, 13(a) and (b), these thin film transistors 50 and 60 are formed with substantially the same cross-sectional structure as in the thin film transistors for pixel switching on the glass substrate 130 in which the pixel portion 1 is formed. That is, on the glass substrate 130 as a substrate, a bedding protection film 132 formed of a silicon oxide film (SiO$_2$) or the like is formed as a buffer layer, and on the surface of the bedding protection film 132, a semiconductor film formed of polysilicon or the like is formed with channel regions 54 and 64, drain regions 53 and 63, and source regions 52 and 62 of the thin film transistors 50 and 60. On the channel regions 54 and 64, gate electrodes 51 and 61 are formed, with a gate insulating film 75 formed of a silicon oxide film (SiO$_2$) or the like between the channel regions 54 and 64 and the gate electrodes 51 and 61. In these thin film transistors 50 and 60, in the source regions 52 and 62, wires 94 are connected through contact holes which go through a first interlayer insulating film 136 formed of the gate insulating film 75 and SiO$_2$ or the like. In the same manner, in the drain regions 53 and 63, wires 99 are connected through contact holes which go through the gate insulating film 75 and the first interlayer insulating film 136 in the drain regions 53 and 63. Furthermore, in the capacitance element 13d, the lower electrode 72a is formed on the surface of the bedding protection film 132, and on the surface of the lower electrode 72a, a dielectric film formed of the same film as in the gate insulating film 75 and the electrodes 73 formed of the same film as in the gate electrodes 51 and 61 are formed in this order. Here, the lower electrode 72a is formed of the same material as in the semiconductor layer. Thus, the capacitance elements 13d are formed by the lower electrode 72a and the upper electrodes 73, with the gate insulating film 75 as a dielectric film. The lower electrode 72a of the capacitance elements 13d and the drain regions 53 and 63 of the thin film transistors 50 and 60 are connected through the connecting portion 76 and the wires 99.

In the D/A converter 13 which is thus structured, the capacitance of the capacitance element 13d6 corresponding to the sixth bit of the image signal is the largest, and the occupied region is also the largest. Therefore, the capacitance element 13d corresponding to the sixth bit of the image signal is disposed in a region with low wire density, closest to the element portion 1. Meanwhile, the capacitance of the capacitance element 13d1 corresponding to a first bit of the image signal is the smallest, and the occupied region is the smallest. Therefore, the capacitance elements 13d corresponding to a first bit of the image signal is disposed in a region furthest from the element portion 1 where the wire density is high, that is, in the region closest to the level shifter circuit 21a.

Then, in the order of the largest occupied region, from the element portion 1, the capacitance element 13d5 corresponding to the fifth bit of the image signal, the capacitance element 13d4 corresponding to the fourth bit of the image signal, the capacitance element 13d3 corresponding to the third bit of the image signal, and the capacitance element 13d2 corresponding to the second bit of the image signal are disposed. At this time, the size order of the occupied region is $$13d1 < 13d2 < 13d3 < 13d4 < 13d5 < 13d6$$

Furthermore, as is clear from FIG. 12, with respect to each capacitance element 13d, the capacitance element 13d corresponding to the $n^{th}$ ($1 \leq n \leq 6$) bit of the image signal is structured by a combination of $2^{n-1}$ unit cells.

For example, in the capacitance element 13d1 corresponding to the first bit of the image signal, only one substantially rectangular upper electrode 72a is used. Meanwhile, in the capacitance element 13d2 corresponding to the second bit of the image signal, a lower electrode 72a, with dimensions double those of the lower electrode 72a of the capacitance elements 13d1, and an upper electrode 73, which has a shape and size corresponding to two rectangular electrodes of the same shape and size as the upper electrode 73 of the capacitance element 13d1, are used. Therefore, in the capacitance element 13d2, the opposing region between the lower electrode 72a and the upper electrode 73 is twice that in the capacitance element 13d1. However, in the upper electrode 73 of the capacitance element 13d2, a slit is formed at a position overlapping the lower electrode 72a. Therefore, in the capacitance element 13d2, among the lower electrode 72a and the upper electrode 73, the total dimension of the opposing edge portion of one electrode is twice that of the other electrode. Therefore, if the capacitance element 13d1 corresponding to the first bit of the image signal is a unit cell, in the capacitance element 13d2 corresponding to the second bit of the image signal, two of these unit cells (terminal capacitance element 13d1) are provided in the structure. Therefore, even if there is irregularity between the substrates with respect to the processing dimension, within substrates which have been processed with the same condition, the capacitance of the capacitance element 13d2 is twice the capacitance of the capacitance element 13d1.

Furthermore, in the capacitance element 13d3 corresponding to the third bit of the image signal, two rows of lower electrodes 72a, with twice the dimension of the lower electrodes 72a of the capacitance element 13d1, and an upper electrode 73, which has a shape and size corresponding to four rectangular electrodes of the same shape and size as the upper electrode 73 of the capacitance element 13d1, are used. Therefore, in the capacitance element 131d3, the opposing region between the lower electrode 72a and the upper electrode 73 is four times that in the capacitance elements 13d1. However, in the upper electrode 73 of the capacitance element 13d3, a slit is formed in a position overlapping the lower electrode 72a. Therefore, in the capacitance element 13d3, among the lower electrode 72a and the upper electrode 73, the total dimension of the edge portion of one electrode is four times that of the other electrode. Therefore, if the capacitance element 13d1 corresponding to the first bit of the image signal is a unit cell, in the capacitance element 13d3 corresponding to the third bit of the image signal, four unit cells (terminal capacitance element 13d1) are provided in the structure. Because of this, even if there is irregularity between the substrates with respect to the process dimension, within substrates which have been processed with the same condition, the capacitance of the capacitance element 13d3 is four times the capacitance of the capacitance element 13d1.

Furthermore, in the capacitance element 13d4 corresponding to the fourth bit of the image signal, one row of lower electrodes 72a, with dimensions twice those of the lower electrode 72a of capacitance element 13d1, two rows of lower electrodes 72a, with dimensions three times those of the lower electrode 72a of the capacitance elements 13d1, and an upper electrode 73, which has a shape and size corresponding to eight rectangular electrodes of the same shape and size as the upper electrode 73 of the capacitance element 13d1, are used. Therefore, in the capacitance element 13d4, the opposing region between the lower electrode 72a and the upper electrode 73 is eight times that in the capacitance element 13d1. However, in the upper electrode 73 of the capacitance element 13d4, slits are formed in positions overlapping the lower electrode 72a. Therefore, in the capacitance element 13d4, among the lower electrode 72a and the upper electrode 73, the total dimension of the edge portion of one electrode is eight times that of the other electrode. Therefore, if the capacitance element 13d1 corresponding to the first bit of the image signal is a unit cell, in the capacitance element 13d4 corresponding to the fourth bit of the image signal, eight unit cells (terminal capacitance element 13d1) are provided in the structure. Because of this, even if there is irregularity between substrates with respect to the process dimension, within substrates which have been processed with the same condition, the capacitance of the capacitance element 13d4 is eight times the capacitance of the capacitance element 13d1.

The other capacitance elements 13d5 and the 13d6 are also formed based upon the same design rule, so the capacitance of the respective capacitance elements 13d can be set with high accuracy at a ratio of 1:2:4 . . .

Furthermore, if accuracy of the process dimension is high to some degree, by omitting the formation of a slit in the upper electrode 73, in each capacitance element 13d, a region occupied by the upper electrode 73 can be smaller.

Furthermore, in the switch circuits 13c, an N-channel type thin film transistor 50 and a P-channel type thin film transistor 60 are complimentarily connected. In this embodiment, in any of the thin film transistors 50 and 60, a double gate type thin film transistor is used. However, the width dimension in a channel longitudinal direction of the gate electrode 61 of the P-channel type thin film transistor 60 is set to be shorter than the width dimension in a channel longitudinal direction of the gate electrode 51 of the N-channel type thin film transistor 50. Therefore, the P-channel thin film transistor 60 is formed so that the ON electric current is relatively large, such that the ON electric current between the P-channel thin film transistor 60 and the N-channel type thin film transistor 50 is balanced.

Furthermore, in the switch circuits 13c, depending upon which of the bits the image signal corresponds to, the channel width is changed. That is, among the switch circuits 13c, in the switch circuit 13C1 corresponding to the first bit of the image signal, the channel width of the thin film transistors 50 and 60 is relatively narrow, and in the switch circuit 13C2 corresponding to the second bit of the image signal, the channel width of the thin film transistors 50 and 60 is set at two times the channel width of the thin film transistors 50 and 60 used in the switch circuit 13C1. Additionally, in the switch circuit 13C3 corresponding to the third bit of the image signal, the channel width of the thin film transistors 50 and 60 is set at four times the channel width of the thin film transistors 50 and 60 of the switch circuit 13C1. Therefore, in the switch circuit 13c, the magnitude of parasitic capacitance which increases with channel width is in a relationship such that it increases with the ratio of the capacitance of the corresponding capacitance element. Therefore, if the parasitic capacitance of the switch circuit 13c is considered as a capacitance element integrally formed with the capacitance element, the capacitance corresponding to each bit can be set with high accuracy.

Additionally, in this embodiment, although not depicted, in the analog switches 13a, also, in the same manner as in the switch circuits 13c, the width dimension of the gate electrode of the P-channel type thin film transistor in a channel longitudinal direction is set to be shorter than the width dimension of the gate electrode of the N-channel type thin film transistor in the channel longitudinal direction. Therefore, the P-channel type thin film transistor is structured so that the ON electric current is relatively large, such that the ON electric current between the P-channel type thin film transistor and the N-channel type thin film transistor is balanced. Furthermore, in the analog switches 13a, with the same type of relationship as the switch circuits 13c, the channel width corresponding to one of the bits of the image signal is changed. That is, the channel width of the thin film transistors 50 and 60 is as wide as an analog switch 13a corresponding to a capacitance element 13d with a large capacitance. Therefore, when electric current discharged from the capacitance element 13d goes through the analog switches 13a and is output, even if the electric current wave form is distorted in the analog switches 13a because the degree is the same between the analog switches 13a, an analog driving signal with a desired wave form can be output.

Furthermore, the structure of the even number data line driving circuit 3 is the same as the structure of the above-described odd number data line driving circuit 2, but reversed from top to bottom, so a detailed description is omitted.

Figure 14:
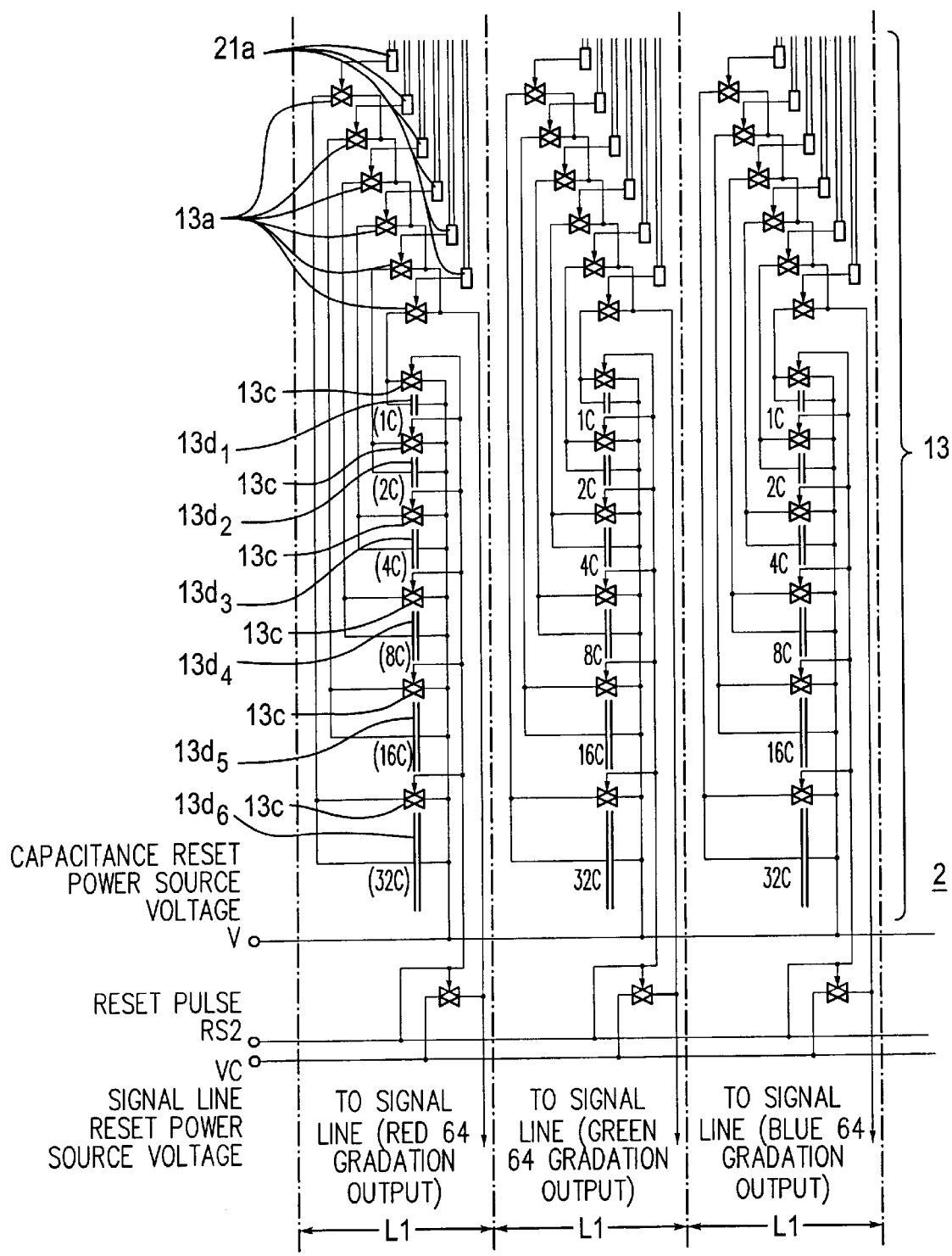
FIG. 14 is a block diagram showing a plan layout of each element in a modified example of a rear portion of the data line driving circuit shown in FIG. 11.

Additionally, in the layout shown in FIG. 11, wires which supply a reset pulse RS and a signal line reset power source voltage go substantially through the center of the region where the D/A converter 13 is formed, but, as shown in FIG. 14, this invention can also apply in a case in which the wires which supply the reset pulse RS and the signal line reset power source voltage can go between the region where the D/A converter 13 is formed and the pixel portion 1 without going through the region where the D/A converter 13 is formed.

(Main Effects of this Embodiment)

As explained above, according to the structure of each signal line driving data driver which forms the electro-optical device 100 of this embodiment, processing voltage in digital processing of an input image signal can be set lower than the voltage of the data signal, so digital noise can be decreased, and low electric power consumption can be achieved for the entire electro-optical device 100.

Furthermore, each clocked gate, the first latch 11, the second latch 12, the logic portion 20, and the level shifter 21 are disposed opposite to the element portion 1, with the D/A converter 13 in-between. Additionally, each clocked gate, the first latch 11, the second latch 12, the logic portion 20, the level shifter 21 and the D/A converter 13 are disposed within a region at a distance equal to the interval of the pixel G in a direction perpendicular to the data lines X1, X2, . . . , and Xm. Furthermore, the capacitance elements 13d are disposed at a position closest to the element portion 1, such that a circuit to perform digital processing and a circuit to perform analog processing are isolated from each other. Therefore, leakage of noise from a circuit which performs digital processing into a circuit which performs analog processing can be decreased.

Furthermore, among various capacitance elements 13d corresponding to each bit of an image signal, the capacitance element 13d with the largest capacitance is disposed at a position closest to the element portion 1. Additionally, each capacitance element 13d is arranged in an order such that the farther it is from the element portion 1, the smaller the capacitance becomes. Because of this, by arranging the capacitance elements 13d with the largest occupied region at positions in which the number of wires is least, each element can be arranged to effectively use the region on the substrate of the electro-optical device 100 without waste.

Furthermore, among the various capacitance elements 13d, the capacitance element 13d corresponding to the $n^{th}$ bit of the image signal is constituted by the same number of unit cells, so deterioration of accuracy of the D/A converter 13 can be prevented by considering irregularities in processing when manufacturing the capacitance elements with a large surface area.

Additionally, each analog switch 13a is constituted by complementary thin film transistors, and the channel width of the analog switch 13a corresponding to the $n^{th}$ bit of digital value in the image signal is $2^{n-1}$ times the unit channel width. Therefore, the ratio between the capacitance of the capacitance elements 13d for each bit and the channel width of the analog switches 13a becomes constant. Because of this, a so-called through-voltage can be made to be constant, and accuracy of a data signal can be improved.

Additionally, the capacitance of each capacitance element 13d is made to be smaller than the capacitance which it originally should have been by the amount of between-wire capacitance received by the capacitance element 13d from other wires. Therefore, deterioration of accuracy of the data signal can be prevented when the apparent capacitance of each capacitance element 13d increases due to the effect of capacitance between wires.

Furthermore, the latch circuits A1R–A6R and B1R–B6R, the logic circuits R1R–R6R, each level shifter 21a, each analog switch 13a and each capacitance element 13d are aligned and disposed for each bit in a direction of the data line X1R. Additionally, among the signal lines connected to each element, wires parallel to the data line X1R, such as the signal lines 40 and the like, are isolated from each other in a plan view, such that a so-called wire crossover surface area is minimized, and low electric power consumption can be achieved. At the same time, shorts can be prevented during the fabricating process, and yield can be improved.

Furthermore, the signal lines 42 which are formed in various wire layers are alternately formed in a direction parallel to the data line X1R, so even if the signal lines 42 are run using multi-layer wiring, wires formed between the various layers do not sandwich an interlayer insulating film and overlap each other. Therefore, even if each element is filled to a maximum density within a predetermined region, generation of parasitic capacitance between these wires can be prevented, and even lower electric power consumption can be achieved.

By so doing, the electro-optical device 100 can be made to be smaller, accuracy can be improved, and lower electric power consumption can be achieved.

(Method of Fabricating an Electro-optical Device)

Figure 15:
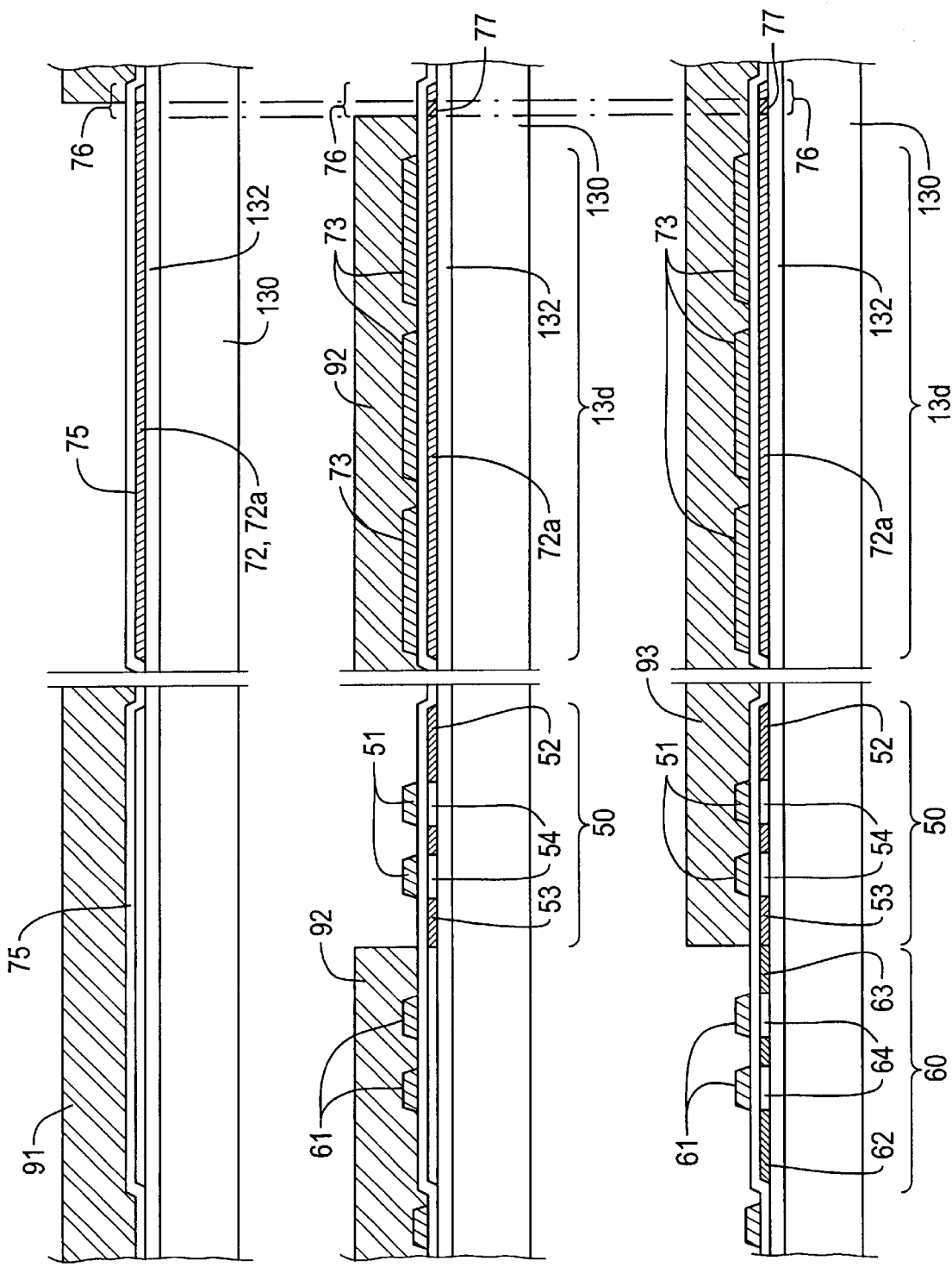
FIGS. 15(a)–(c) are process cross-sectional views showing a process of forming capacitance elements and switch elements of a data line driving circuit in a process of fabricating the electro-optical device shown in FIG. 1.

With reference to FIG. 15, one example of a method of fabricating an active matrix substrate is explained in a process of fabricating an electro-optical device to which this invention is applied.

FIG. 15 is a process cross-sectional view showing a process of fabricating of an electro-optical device.

The fabricating method shown here shows a process of fabricating a polysilicon thin film transistor which forms a thin film transistor on a glass substrate or the like in low temperature at 600° C. or less. Furthermore, when the active matrix substrate 103 of the electro-optical device is fabricated in this embodiment, the pixel portion 1 and the driving circuit are formed using the same process. Furthermore, the thin film transistors 30 for pixel switching formed in the pixel portion 1 and the thin film transistors 60 and 70 for the driving circuits have a common basic structure. Furthermore, the accumulating capacitors 31 formed in the pixel portion 1 and the capacitance elements 13d of the driving circuit have a common basic structure of. Therefore, in the following explanation, with respect to the driving circuit, characteristic portions are explained among the processes of fabricating the N-channel type thin film transistors 50 and P-channel type thin film transistor 60 which constitute the switch circuits, and the capacitance elements 13d.

In order to fabricate the active matrix substrate 103 using the electro-optical device 100 of this embodiment, first, as shown in FIG. 15(a), a bedding protection film 132 is formed on the glass substrate 130, and on this, an amorphous silicon film is laminated. After that, by performing thermal processing such as laser annealing processing or the like to the silicon film, the amorphous silicon film is re-crystallized, and a crystallized polysilicon film is formed. Next, the polysilicon film is patterned, and island-shaped polysilicon films 71 and 72 are simultaneously formed. Next, a gate insulating film 75 is laminated on the films 71 and 72.

Next, a resist 91 is formed over regions other than the region which will become the connecting portion 76 and the lower electrode 72a of the capacitance elements 13d. In this state, a $PH_3/H_2$ ion is doped into a polysilicon film 72 as a donor through the gate insulating film 75. In this doping condition, for example, a 31P dose amount is approximately $3e^{14}$–$5e^{14}/cm^2$, and approximately 80 keV energy is needed. Through this process, the connecting portion 76 and the lower electrode 72a are formed. After this, a resist mask 91 is removed.

Next, wires 96 integral with the gate electrodes 51 and 61, as shown in FIG. 15(b) wires 97 integral with the upper electrode 73 of the capacitance element 13d, as shown in FIG. 15(b) the scanning lines Y1, Y2, Y3, . . . , and the like are formed. In the formation of these wires, for example, after a pattern of the gate electrode or the like is formed on a resist and after metal such as tantalum is sputtered or vacuum-vapor deposited, a method of peeling the resist or the like can be used.

After the gate electrodes 51 and 61 and the like are thus formed, a resist mask 92 is formed in the regions which will become the thin film transistor 60 and capacitance elements 13d. In this state, a $PH_3/H_2$ ion is doped again. With respect to the doping condition, for example, a 31P dose amount is approximately $5e^{14}$ to $7e^{14}/cm^2$, approximately 80 keV energy is needed. By so doing, the source region 52, the drain region 53, and the channel region 54 of the thin film transistor 50 are formed. Here, an impurity is introduced to a portion of the connecting region 76 in both of the previously performed ion dopings. Therefore, in the connecting region 76, high density in which ions have been twice introduced is formed. Therefore, if a contact hole is formed in a region including this high density region, connection with low resistance can be performed.

Next, after removing the resist mask 92, as shown in FIG. 15(c), in a state in which a resist mask 93 is formed over the entire region excluding the region in which the thin film transistor 60 is formed, $B_2H_6/H_2$ ion is doped as an acceptor. For the doping conditions, for example, for an 11B dose amount, $5e^{14}/cm^2$ or more is needed, and approximately 25 keV–30 keV energy is needed. As a result, the source region 62, the drain region 63, and the channel region 64 of the thin film transistor 60 are formed. After that, the resist mask 93 is removed.

Finally, as shown in FIG. 13, after peeling the resist 93, the first interlayer insulating film 136 is formed. Next, a contact hole is formed, and electrodes, formed of a metal electrode such as aluminum or the like, and data lines X1, X2, and X3, . . . are formed.

Next, a second interlayer insulating film 137 is lamninated. Furthermore, in the pixel portion 1, a contact hole is formed at a position corresponding to the drain region 312 of the thin film transistor 30 for pixel switching, and after that, a pixel electrode 108 is formed.

According to this type of fabricating method, in the connecting portion between the lower electrode 72a of the capacitance element 13d and the wires 95, a high density area 77 is formed in which $PH_3/H_2$ ion is twice introduced over a connecting region 76 that is integral with the lower electrode 72a, and a contact hole is formed so as to include this high density area 77. Therefore, even if there are many defects in this region, these two areas can be securely connected.

Furthermore, in the third process, because $PH_3/H_2$ ion is introduced after the gate insulating film 75 is formed, the silicon films 71 and 72 are not damaged during the ion introduction, and ion introduction can be performed with much higher energy, so introduction of an impurity can be performed in a short period.

OTHER EMBODIMENTS

Furthermore, in the above-described embodiment, this invention is applied to an electro-optical device 100 using liquid crystal as an electro-optical substance, but other than this, for example, this invention can be applied to a display device in which a current driven type voluntary optical element exists within the pixels.

(Example of a Structure of an Electronic Device)

The following explains embodiments of an electronic device provided with the electro-optical device 100 explained above, in detail, with reference to FIGS. 16–20.

Figure 16:
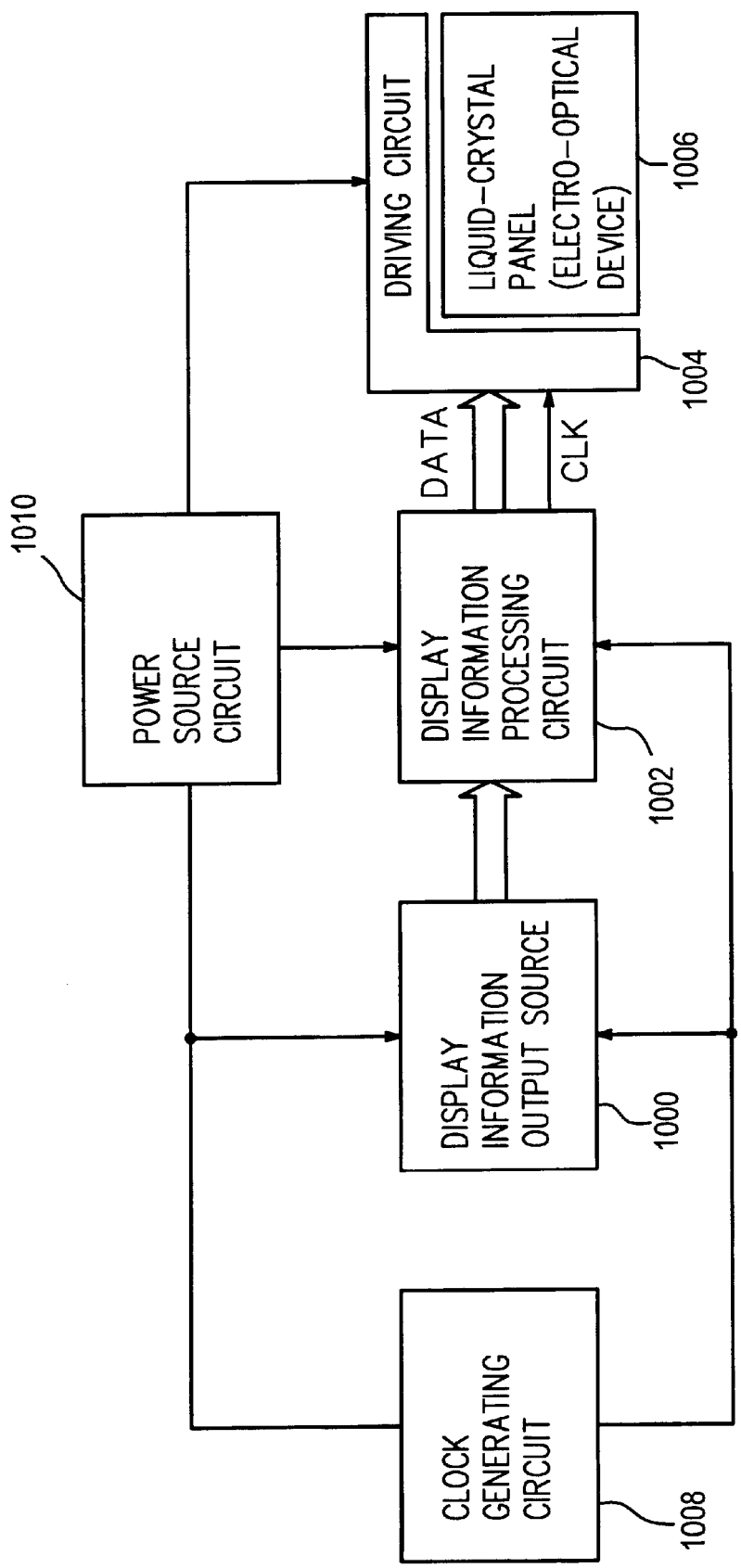
FIG. 16 is a block diagram showing a schematic structure of an electronic device in which an electronic optical device incorporating this invention is installed.

First, FIG. 16 shows a schematic structure of an electronic device provided with the electro-optical device 100.

In FIG. 16, the electronic device is constituted by a display information output source 1000, a display information processing circuit 1002, a display driving circuit 1004 including the scanning line driving circuit 22, the odd number data line driving circuit 2 and the even number data line driving circuit 3 described earlier, a liquid crystal device 1006 including. the element portion 1, a clock generating circuit 1008, and a power source circuit 1010.

Here, the display information output source 1000 is constituted including a memory such as a ROM (Read Only Memory), a RAM (Random Access Memory), an optical disk device or the like, and a synchronizing circuit which synchronizes and outputs a television signal. Based upon the clock signal from the clock generating circuit. 1008, display information such as an image signal in a specified format is output to the display information processing circuit 1002.

Furthermore, the display information processing circuit 1002 is structured including various known processing circuits such as an amplifying/polarity reversing circuit, a phase developing circuit, a rotation circuit, a gamma correction circuit, a clamp circuit and/or the like. The digital signal is sequentially generated from the display information which has been input based upon the clock signal from the clock generating circuit 1008 and is output to the display driving circuit 1004 along with a clock signal CLK.

After that, the display driving circuit 1004 drives the liquid crystal device 1006 by the driving method described earlier by the scanning line driving circuit 22, the odd number data line driving circuit 2, and the even number data line driving circuit 3.

At this time, the power source circuit 1010 supplies a specified power source to each circuit described above.

Furthermore, in forming the electro-optical device 100 (1006 in FIG. 16) on the active matrix substrate, in addition to the display driving circuit 1004, the display information processing circuit 1002 and/or the like can also be formed.

Figure 17:
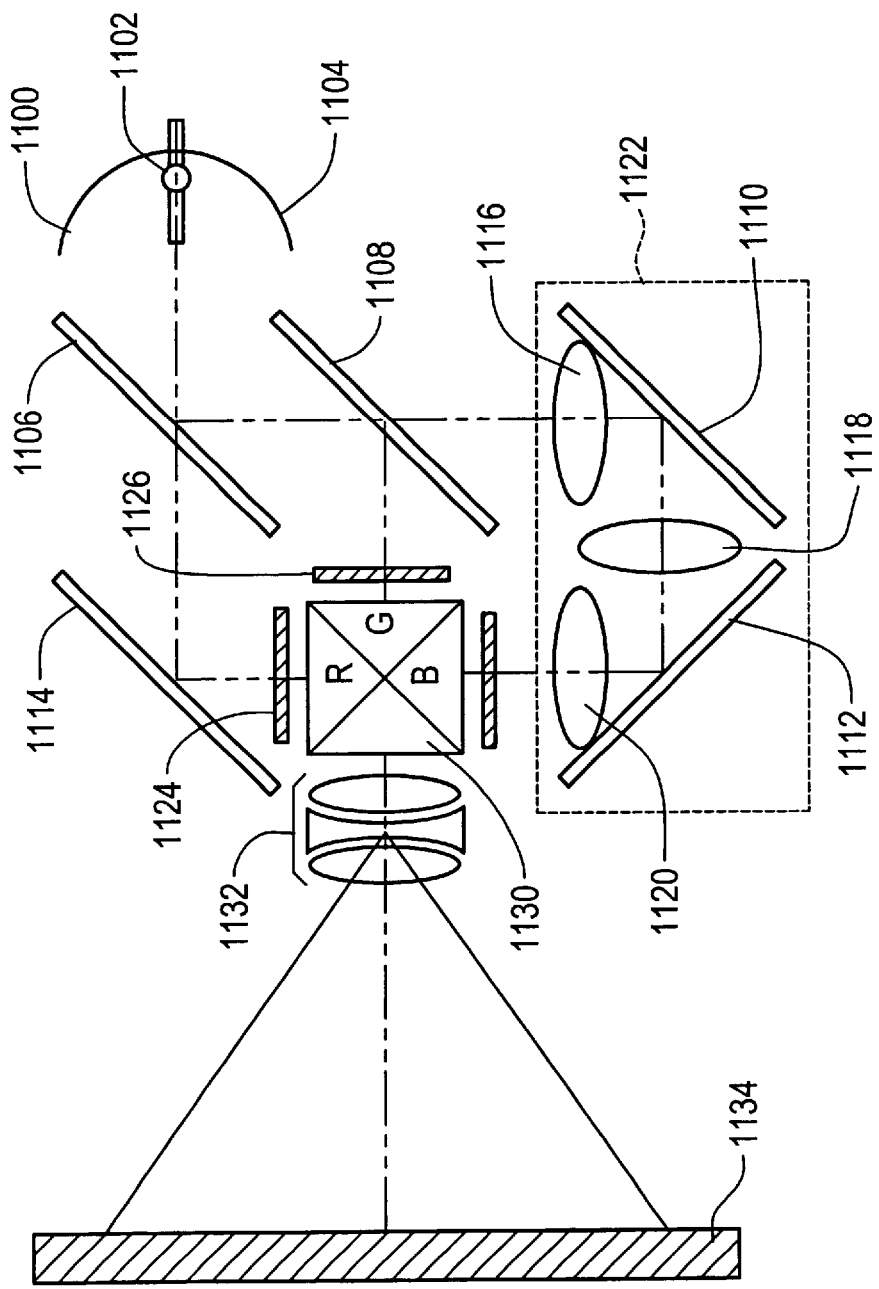
FIG. 17 is a cross-sectional view showing a structure of a projection display device (liquid crystal projector) as one example of an electronic device in which an electro-optical device incorporating this invention is installed.
Figure 18:
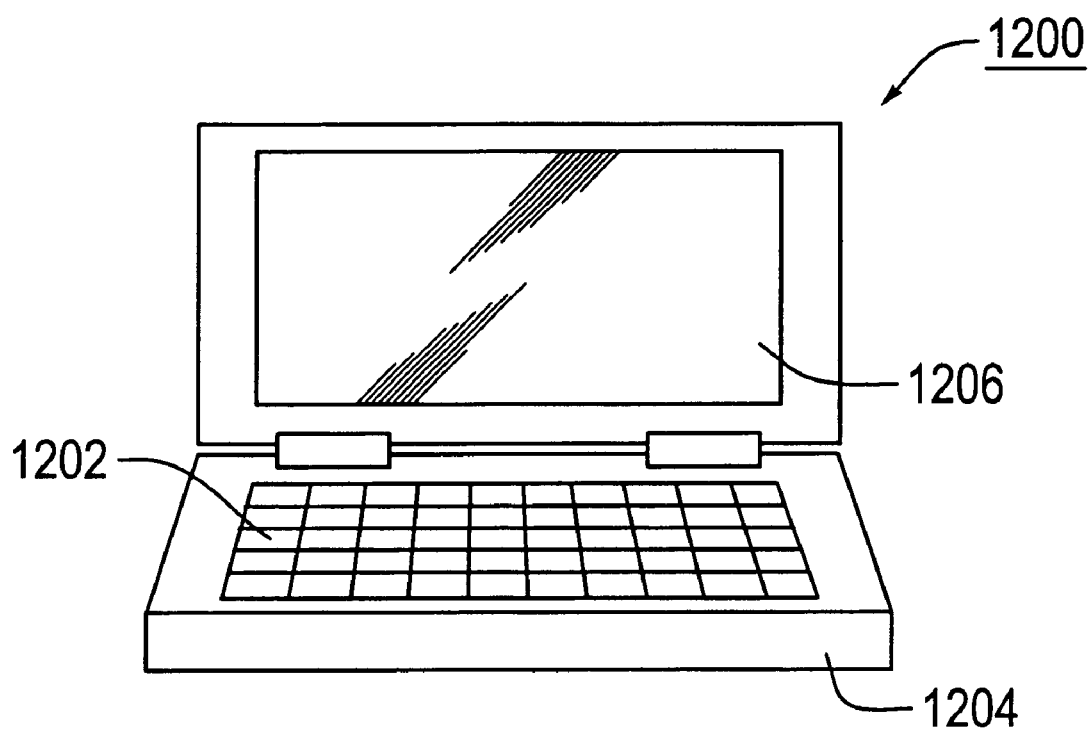
FIG. 18 is a plan view showing the appearance of a personal computer as one example of an electronic device in which an electro-optical device incorporating this invention is installed.

As electronic devices with this type of structure, a device such as a liquid crystal projector shown in FIG. 17, a personal computer (PC) capable of multi-media shown in FIG. 18, an engineering work station (EWS), a portable telephone, a word processor, a television, a view finder type or a monitor direct-viewing type videotape recorder, an electronic diary, a portable calculator, a vehicle navigation device, a POS terminal, a touch panel and the like can be listed.

Figure 19:
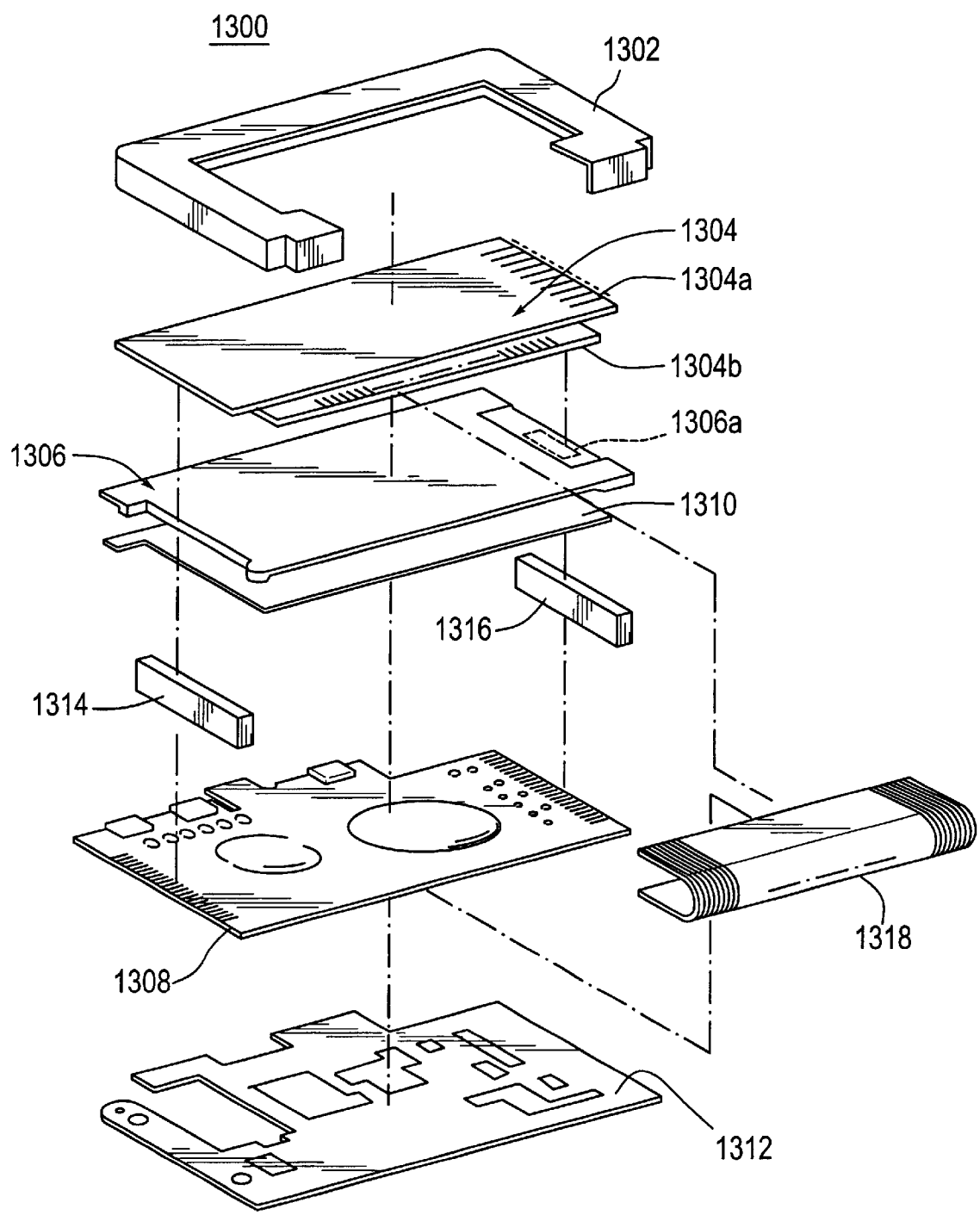
FIG. 19 is a blown-apart perspective view showing a structure of a pager as one example of an electronic device in which an electro-optical device incorporating this invention is installed.
Figure 20:
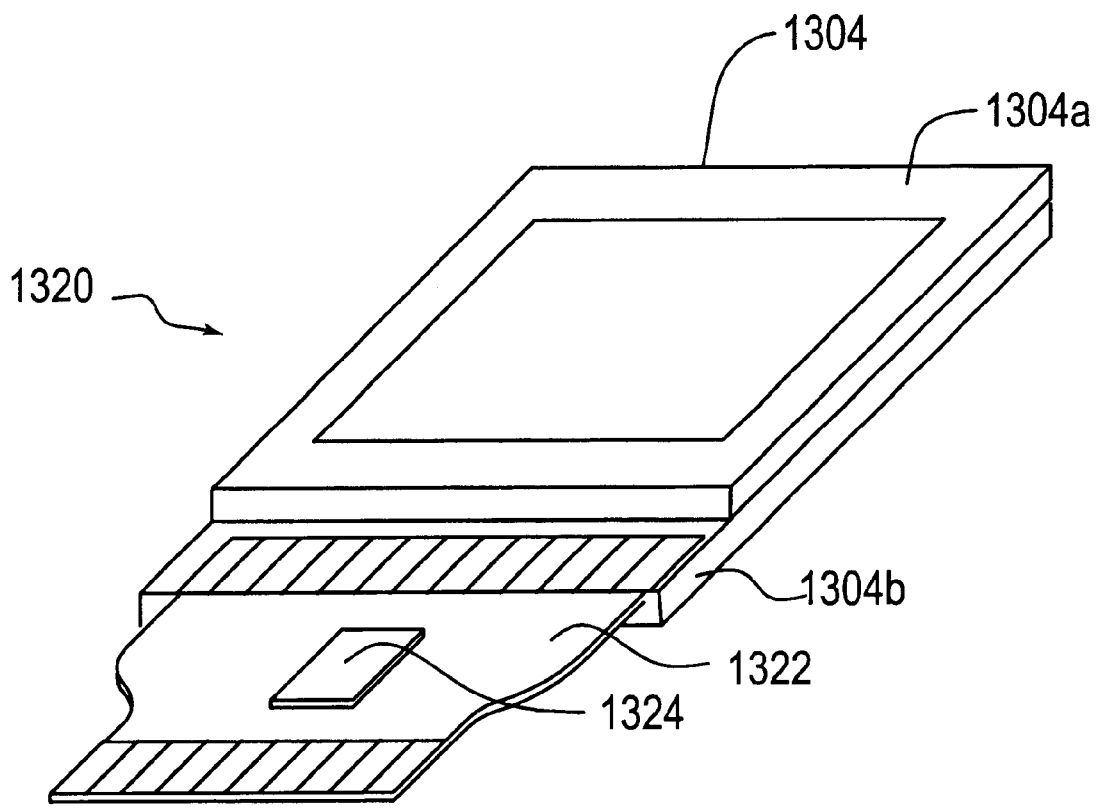
FIG. 20 is a perspective view showing the appearance of an electro-optical device using a TCP as one example of an electro-optical device to which this invention is applied.

The following shows specific examples of an electronic device which is thus structured in FIGS. 17–19.

In FIG. 17, a liquid crystal projector which is one example of an electronic device is a projection type liquid crystal projector and is constituted by a light source 1100, dichroic mirrors 1106 and 1108, reflecting mirrors 1110, 1112, and 1114, an incident lens 1116, a relay lens 1118, an emitting lens 1120, liquid crystal light valves 1124, 1126, and 1128, a cross-dichroic prism 1130, and a projection lens 1132.

At this time, with respect to the liquid crystal light valves 1124, 1126, and 1128, the display driving circuit 1004 described above prepares three liquid crystal modules including a liquid crystal device 1006 mounted on the thin film transistor array substrate and uses these as liquid crystal light valves, respectively.

Furthermore, the light source 1100 is structured by a lamp 1102 such as metal halide lamp or the like, and a reflector 1104 which reflects the light of a lamp 1102.

In the liquid crystal projector which is thus structured, the dichroic mirror 1106 which reflects blue and green light transmits the red light among the white light beams from the light source 1100 and reflects the blue and green light. Furthermore, the transmitted red light is reflected by the reflecting mirror 1114 and is incident to a red light liquid crystal light valve 1124.

Meanwhile, the green light among the colored light reflected by the dichroic mirror 1106 is reflected by the dichroic mirror 1108 which reflects green light and is incident to a green light liquid crystal light valve 1126.

Additionally, the blue light goes through the dichroic mirror 1108. With respect to this blue light, in order to prevent light loss due to a long optical path, a light conducting member 1122 formed of a relay lens system including an incident lens 1116, a relay lens 1118, and an emitting lens 1120 is disposed, and through this, the blue light is incident to the blue light liquid crystal light valve 1128.

Furthermore, the three colors of light modulated by each light valve are incident to the cross-dichroic prism 1130. Four prisms are connected for this cross-dichroic prism 1130, and a dielectric multi-layer film which reflects red light inside and a dielectric multi-layer film which reflects blue light are formed in an X shape on the inner surfaces of the cross-dichroic prism 1130. Three colors' of light are composed by these dielectric multi-layer films, and light showing a color image is formed.

After that, the composed light is projected onto a screen 1134 by the projection lens 1132, which is a projection optical system, and the image is enlarged and displayed.

In FIG. 18, a laptop type personal computer 1200, which is another example of an electronic device, has a liquid crystal display 1206, in which the above-mentioned liquid crystal device 1006 is provided within a top cover casing, and a main body portion 1204 which houses a CPU, a memory, a modem, and/or the like and is incorporated with a keyboard 1202.

Furthermore, as shown in FIG. 19, liquid crystal is filled between two transparent substrates 1304a and 1304b, and a liquid crystal device substrate 1304 is provided in which the above-described display driving circuit 1004 is mounted on a thin film transistor array substrate. One of the two transparent substrates 1304a and 1304b which structure the liquid crystal device substrate device 1304 is connected to a TCP (Tape Carrier Package) 1320 (see FIG. 20), where an IC chip 1324 is mounted on a polyimide tape 1322 on which a metal conductive film is formed, and this can be manufactured, sold, and used as a liquid crystal device which is a part of an electronic device.

In addition, other than the electronic devices explained with reference to FIGS. 17–20, a device with a liquid crystal television, a view finder type or a monitor direct-viewing type videotape recorder, a vehicle navigation device, an electronic diary, a calculator, a word processor, a work station, a portable telephone, a television telephone, a POS terminal, and a touch panel can be listed as examples of the electronic device shown in FIG. 16.

Furthermore, this invention is not limited to the above-mentioned embodiment, but various modifications are possible within the scope of this invention. For example, this invention is not limited to a device which is applied to driving of the various liquid crystal devices described above, but is also applicable to an electro-luminescent plasma display device.

According to this embodiment, various electronic devices can be realized with an electro-optical device 100 in which an image can be displayed in a smaller device.

INDUSTRIAL USE OF THE INVENTION

As explained above, in this invention, after a digital processing element performs digital processing which is set in advance to a digital driving signal and generates a processing digital driving signal, a voltage increasing element increases the voltage of the processing digital driving signal and generates an increased-voltage digital driving signal. After that, a digital/analog converting element digital/analog converts the increased-voltage digital driving signal and generates an analog driving signal, and applies it to each electro-optical element. Thus, because processing voltage in digital processing of the input digital driving signal can be lower than the voltage of the analog driving signal, digital noise can be decreased in an electro-optical device and an electronic device, and lower electric power consumption can be achieved for the entire electro-optical element driving circuit.

What is claimed is:

1. An electro-optical device comprising:

a plurality of data inputting lines corresponding to a bit number;

a plurality of signal lines for supplying signals to a plurality of electro-optical elements;

a plurality of digital processing elements for performing digital processing of digital driving signals supplied from the plurality of data inputting lines, the plurality of digital processing elements corresponding to each of the plurality of signal lines;

a plurality of voltage transforming elements each of which transforms a digital voltage supplied from each of the digital processing elements; and a plurality of digital/analog converting elements each of which converts an output of each of the plurality of voltage transforming elements into an analog driving signal, wherein the plurality of digital/analog converting elements comprise a plurality of analog switches and a plurality of capacitance elements, wherein capacitances of the capacitor elements are mutually different, and wherein, if n and u are respectively, a natural number and an arbitrary unit of capacitance, a capacitance of a capacitor element corresponding to $n^{th}$ bit among the plurality of capacitor elements is expressed by $2^{n-1}u$.

2. The electro-optical device according to claim 1, wherein capacitance of the capacitor element corresponding to $n^{th}$ bit comprises $2^{n-1}$ cells of which the capacitance is u.

3. An electro-optical device comprising:

a plurality of data inputting lines corresponding to a bit number;

a plurality of signal lines for supplying signals to a plurality of electro-optical elements;

a plurality of digital processing elements for performing digital processing of digital driving signals supplied from the plurality of data inputting lines, the plurality of digital processing elements corresponding to each of the plurality of signal lines;

a plurality of voltage transforming elements each of which transforms a digital voltage supplied from each of the digital processing elements; and a plurality of digital/analog converting elements each of which converts an output of each of the plurality of voltage transforming elements into an analog driving signal, wherein the plurality of digital/analog converting elements comprise a plurality of analog switches and a plurality of capacitance elements, and wherein if n and u are respectively, a natural number and an arbitrary unit of capacitance, a capacitance of a capacitor element corresponding to $n^{th}$ bit among the plurality of capacitor elements is smaller than a nominally determined capacitance of $2^{n-1}$ u of the capacitor element.

4. An electro-optical device comprising:

a plurality of data inputting lines corresponding to a bit number;

a plurality of signal lines for supplying signals to a plurality of electro-optical elements;

a plurality of digital processing elements for performing digital processing of digital driving signals supplied from the plurality of data inputting lines, the plurality of digital processing elements corresponding to each of the plurality of signal lines;

a plurality of voltage transforming elements each of which transforms a digital voltage supplied from each of the digital processing elements; and a plurality of digital/analog converting elements each of which converts an output of each of the plurality of voltage transforming elements into an analog driving signal, wherein the plurality of digital/analog converting elements comprise a plurality of analog switches and a plurality of capacitance elements, and wherein a capacitor element with the largest capacitance among the capacitor elements is disposed the closest position to one of the plurality of signal lines that corresponds to the capacitor elements.

5. An electro-optical device comprising:

a plurality of data inputting lines corresponding to a bit number;

a plurality of signal lines for supplying signals to a plurality of electro-optical elements;

a plurality of digital processing elements for performing digital processing of digital driving signals supplied from the plurality of data inputting lines, the plurality of digital processing elements corresponding to each of the plurality of signal lines;

a plurality of voltage transforming elements each of which transforms a digital voltage supplied from each of the digital processing elements; and a plurality of digital/analog converting elements each of which converts an output of each of the plurality of voltage transforming elements into an analog driving signal, wherein the plurality of digital/analog converting elements comprise a plurality of analog switches and a plurality of capacitance elements, and wherein a capacitor element with the largest capacitance among the capacitor elements is disposed the closest position to one of the plurality of signal lines that corresponds to the capacitor elements.

6. The electro-optical device according to claim 5, wherein a distance between a position where on of the capacitor elements is disposed and the signal line increases, as a capacitance of the capacitor element decreases.

7. the electro-optical device according to claim 5, wherein between two adjacent capacitor elements of the plurality of capacitor elements, capacitance of one capacitor element closer to the signal line is larger than that of the other.

* * * * *